United States Patent
Xiao et al.

(10) Patent No.: US 11,315,496 B2
(45) Date of Patent: Apr. 26, 2022

(54) SHIFT REGISTER UNIT AND DRIVING METHOD THEREOF, GATE DRIVE CIRCUIT AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Lijun Xiao, Beijing (CN); Zhenguo Tian, Beijing (CN); Yanan Zhao, Beijing (CN); Shaohong Gao, Beijing (CN); Zhiyou Liu, Beijing (CN); Ming Deng, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 444 days.

(21) Appl. No.: 16/472,591

(22) PCT Filed: Jan. 14, 2019

(86) PCT No.: PCT/CN2019/071650
§ 371 (c)(1),
(2) Date: Jun. 21, 2019

(87) PCT Pub. No.: WO2019/233110
PCT Pub. Date: Dec. 12, 2019

(65) Prior Publication Data
US 2021/0358415 A1 Nov. 18, 2021

(30) Foreign Application Priority Data
Jun. 6, 2018 (CN) .......................... 201810573638.2

(51) Int. Cl.
*G09G 3/3266* (2016.01)
*G11C 19/28* (2006.01)

(52) U.S. Cl.
CPC ........... *G09G 3/3266* (2013.01); *G11C 19/28* (2013.01); *G09G 2310/0286* (2013.01)

(58) Field of Classification Search
CPC ............ H01L 27/3272; H01L 27/1248; G09G 3/3233
(Continued)

(56) References Cited

U.S. PATENT DOCUMENTS 10,789,868 B2* 9/2020 Tian ...................... G11C 19/287
2011/0063012 A1* 3/2011 Chan ................ H03K 3/356113
327/333
(Continued)

FOREIGN PATENT DOCUMENTS

CN 102789770 A 11/2012
CN 104616616 A 5/2015
(Continued)

OTHER PUBLICATIONS

International Search Report and Written Opinion dated Mar. 29, 2019; PCT/CN2019/071650.

*Primary Examiner* — Prabodh M Dharia

(57) ABSTRACT

A shift register unit and a driving method thereof, a gate drive circuit and a display device are provided. The shift register unit includes: an input circuit, connected to a pull-up node, and configured to charge the pull-up node according to an input signal; an output circuit, connected to the pull-up node and an output terminal, and configured to output an output signal to the output terminal under control of a voltage of the pull-up node; a reset circuit, connected to the pull-up node, and configured to reset the pull-up node; and a reset signal control circuit, connected to a first reset terminal and the reset circuit, and configured to generate and
(Continued)

output a reset control signal according to a reset control input signal and a reset signal provided by the first reset terminal; the reset control signal is configured to control the reset circuit to perform a reset operation.

16 Claims, 7 Drawing Sheets

(58) Field of Classification Search
USPC .......................................... 345/214; 327/142
See application file for complete search history.

(56) References Cited

U.S. PATENT DOCUMENTS

| | | | |
|---|---|---|---|
| 2014/0055177 A1* | 2/2014 | Chen | G09G 3/3677 327/142 |
| 2014/0169518 A1* | 6/2014 | Kong | G09G 3/3674 377/64 |
| 2016/0300542 A1* | 10/2016 | Zhang | G09G 3/3266 |
| 2016/0372023 A1 | 12/2016 | Zhang et al. | |
| 2017/0301277 A1* | 10/2017 | Shang Guan | G11C 19/184 |
| 2018/0174660 A1 | 6/2018 | Li | |
| 2018/0190173 A1 | 7/2018 | Feng | |
| 2019/0066617 A1* | 2/2019 | Zhao | G11C 19/28 |
| 2019/0096308 A1* | 3/2019 | Lv | G09G 3/20 |
| 2019/0206294 A1 | 7/2019 | Tian et al. | |

FOREIGN PATENT DOCUMENTS

| | | |
|---|---|---|
| CN | 104809985 A | 7/2015 |
| CN | 106486047 A | 3/2017 |
| CN | 107358906 A | 11/2017 |
| CN | 108154835 A | 6/2018 |
| CN | 108735176 A | 11/2018 |
| KR | 20120111396 A | 10/2012 |

* cited by examiner

SHIFT REGISTER UNIT AND DRIVING METHOD THEREOF, GATE DRIVE CIRCUIT AND DISPLAY DEVICE

The present application claims priority of Chinese Patent Application No. 201810573638.2, filed on Jun. 6, 2018, the disclosure of which is incorporated herein by reference in its entirety as part of the present application.

TECHNICAL FIELD

Embodiments of the present disclosure relate to a shift register unit and a driving method thereof, a gate drive circuit and a display device.

BACKGROUND

Gate on array (GOA) technology is one of gate drive technologies of liquid crystal panels. The basic principle of the GOA technology is that a gate drive circuit of a liquid crystal panel is integrated on an array substrate to scan and drive the liquid crystal panel. All of current GOA models adopt cascade models, that is, except for a first stage shift register unit and a last stage shift register unit, an output signal of an output terminal of each intermediate stage shift register unit is used as both a reset signal of a previous stage shift register unit and an input signal of a next stage shift register unit.

However, in a case where one of shift register units is abnormal, the normal operations of previous multi-stage shift register units and next multi-stage shift register units of the abnormal shift register unit will be affected, which can cause serious problems of poor display.

SUMMARY

At least some embodiments of the present disclosure provides a shift register unit, which includes an input circuit, connected to a pull-up node, and configured to charge the pull-up node according to an input signal; an output circuit, connected to the pull-up node and an output terminal respectively, and configured to output an output signal to the output terminal under control of a voltage of the pull-up node; a reset circuit, connected to the pull-up node, and configured to reset the pull-up node; and a reset signal control circuit, connected to a first reset terminal and the reset circuit respectively, and configured to generate and output a reset control signal according to a reset control input signal and a reset signal provided by the first reset terminal; the reset control signal is configured to control the reset circuit to perform a reset operation.

For example, in the shift register unit provided by some embodiments of the present disclosure, the reset signal control circuit is further connected to the output terminal to receive the output signal as the reset control input signal.

For example, in the shift register unit provided by some embodiments of the present disclosure, the reset signal control circuit is further connected to a total reset terminal, and is further configured to stop outputting the reset control signal according to a total reset signal provided by the total reset terminal.

For example, in the shift register unit provided by some embodiments of the present disclosure, the reset signal control circuit comprises a reset control input sub-circuit, a reset control output sub-circuit, and a reset control reset sub-circuit; the reset control input sub-circuit is connected to a first node, and is configured to charge the first node according to the reset control input signal; the reset control output sub-circuit is respectively connected to the first reset terminal, the first node and a second node, and is configured to generate and output the reset control signal to the second node according to the reset signal under control of a voltage of the first node; and the reset control reset sub-circuit is connected to the first node and the total reset terminal, and is configured to reset the first node under control of the total reset signal provided by the total reset terminal.

For example, in the shift register unit provided by some embodiments of the present disclosure, the reset signal control circuit further comprises a reset control noise reduction sub-circuit; the reset control noise reduction sub-circuit is connected to the second node and the total reset terminal, and is configured to perform denoising on the second node under control of the total reset signal provided by the total reset terminal.

For example, in the shift register unit provided by some embodiments of the present disclosure, the reset control input sub-circuit comprises a third transistor, a first terminal of the third transistor is connected to a first preset power supply, a second terminal of the third transistor is connected to the first node, and a control terminal of the third transistor is configured to receive the reset control input signal; the reset control output sub-circuit comprises a fourth transistor and a second capacitor, a first terminal of the fourth transistor is connected to the first reset terminal, a second terminal of the fourth transistor is connected to the second node, a control terminal of the fourth transistor is connected to the first node, a first terminal of the second capacitor is connected to the first node, and a second terminal of the second capacitor is connected to the second node; the reset control noise reduction sub-circuit comprises a fifth transistor, a first terminal of the fifth transistor is connected to the second node, a second terminal of the fifth transistor is connected to a second preset power supply, and a control terminal of the fifth transistor is connected to the total reset terminal; and the reset control reset sub-circuit comprises a sixth transistor, a control terminal of the sixth transistor is connected to the total reset terminal, a first terminal of the sixth transistor is connected to the first node, and a second terminal of the sixth transistor is connected to the second preset power supply.

For example, the shift register unit provided by some embodiments of the present disclosure further includes a reset control input terminal; the reset signal control circuit is further connected to the reset control input terminal to receive the reset control input signal.

For example, in the shift register unit provided by some embodiments of the present disclosure, the reset circuit is further connected to the output terminal, and is configured to reset the output terminal under control of the reset control signal.

For example, the shift register unit provided by some embodiments of the present disclosure further includes: a pull-down circuit, connected to the output terminal and the total reset terminal respectively, and configured to reset the output terminal according to the total reset signal provided by the total reset terminal; a noise control circuit, connected to a second clock signal terminal and a pull-down node respectively, and configured to pull up a voltage of the pull-down node according to a second clock signal provided by the second clock signal terminal; a first denoising circuit, connected to the pull-down node and the pull-up node respectively, and configured to perform denoising on the voltage of the pull-up node under control of the voltage of the pull-down node; and a second denoising circuit, connected to the pull-down node and the output terminal respectively, and configured to perform denoising on the output terminal under control of the voltage of the pull-down node.

For example, in the shift register unit provided by some embodiments of the present disclosure, the reset signal is the second clock signal.

For example, in the shift register unit provided by some embodiments of the present disclosure, the reset signal comprises a plurality of effective sub-signals.

For example, in the shift register unit provided by some embodiments of the present disclosure, the input circuit comprises a first transistor, a first terminal of the first transistor is connected to a control terminal of the first transistor and then connected to an input terminal, a second terminal of the first transistor is connected to the pull-up node, and the input terminal is configured to provide the input signal.

For example, in the shift register unit provided by some embodiments of the present disclosure, the output circuit is further connected to a first clock signal terminal, and configured to generate the output signal according to a first clock signal provided by the first clock signal terminal under control of the voltage of the pull-up node.

For example, in the shift register unit provided by some embodiments of the present disclosure, the output circuit comprises: a second transistor and a first capacitor; a first terminal of the second transistor is connected to the first clock signal terminal, a control terminal of the second transistor is connected to the pull-up node, and a second terminal of the second transistor is connected to the output terminal; and a first terminal of the first capacitor is connected to the control terminal of the second transistor, and a second terminal of the first capacitor is connected to the second terminal of the second transistor.

For example, in the shift register unit provided by some embodiments of the present disclosure, the reset circuit comprises a seventh transistor, a control terminal of the seventh transistor is connected to the reset signal control circuit to receive the reset control signal, a first terminal of the seventh transistor is connected to the pull-up node, and a second terminal of the seventh transistor is connected to a third preset power supply.

For example, in the shift register unit provided by some embodiments of the present disclosure, the reset circuit further comprises an eighth transistor, a first terminal of the eighth transistor is connected to the output terminal, a control terminal of the eighth transistor is connected to the reset signal control circuit to receive the reset control signal, and a second terminal of the eighth transistor is connected to a third preset power supply.

For example, in the shift register unit provided by some embodiments of the present disclosure, the pull-down circuit comprises a ninth transistor, a first terminal of the ninth transistor is connected to the output terminal, a control terminal of the ninth transistor is connected to the total reset terminal, and a second terminal of the ninth transistor is connected to a third preset power supply.

For example, in the shift register unit provided by some embodiments of the present disclosure, the noise control circuit comprises: a tenth transistor, an eleventh transistor, a twelfth transistor, and a thirteenth transistor; a first terminal of the tenth transistor is connected to a control terminal of the tenth transistor and then connected to the second clock signal terminal, and a second terminal of the tenth transistor is connected to a third node; a first terminal of the eleventh transistor is connected to the second clock signal terminal, a control terminal of the eleventh transistor is connected to the third node, and a second terminal of the eleventh transistor is connected to the pull-down node; a first terminal of the twelfth transistor is connected to the third node, a control terminal of the twelfth transistor is connected to the pull-up node, and a second terminal of the twelfth transistor is connected to a third preset power supply; and a first terminal of the thirteenth transistor is connected to the pull-down node, a control terminal of the thirteenth transistor is connected to the pull-up node, and a second terminal of the thirteenth transistor is connected to the third preset power supply.

For example, in the shift register unit provided by some embodiments of the present disclosure, the first denoising circuit comprises a fourteenth transistor, a first terminal of the fourteenth transistor is connected to the pull-up node, a control terminal of the fourteenth transistor is connected to the pull-down node, and a second terminal of the fourteenth transistor is connected to a third preset power supply.

For example, in the shift register unit provided by some embodiments of the present disclosure, the second denoising circuit comprises a fifteenth transistor, a first terminal of the fifteenth transistor is connected to the output terminal, a control terminal of the fifteenth transistor is connected to the pull-down node, and a second terminal of the fifteenth transistor is connected to a third preset power supply.

At least some embodiments of the present disclosure also provide a driving method for driving a shift register unit provided by any one of embodiments of the present disclosure, and the driving method includes: charging the pull-up node according to the input signal; outputting the output signal to the output terminal under control of the voltage of the pull-up node; generating and outputting the reset control signal according to the reset control input signal and the reset signal; and resetting the pull-up node according to the reset control signal.

For example, the driving method of the shift register unit provided by some embodiments of the present disclosure further includes: stopping outputting the reset control signal according to a total reset signal provided by a total reset terminal.

For example, in the driving method of the shift register unit provided by some embodiments of the present disclosure, the reset signal comprises a plurality of effective sub-signals.

At least some embodiments of the present disclosure also provide a gate drive circuit, which includes a plurality of shift register units provided by any one of embodiments of the present disclosure.

For example, in the gate drive circuit provided by some embodiments of the present disclosure, in the plurality of the shift register units, an input terminal of a first shift register unit is connected to a start signal line, and except for the first shift register unit, an input terminal of an N-th shift register unit is connected to an output terminal of an (N−1)-th shift register unit; a first clock signal terminal of a (2M−1)-th shift register unit is connected to a first clock signal line, a second clock signal terminal of the (2M−1)-th shift register unit is connected to a second clock signal line, and a first reset terminal of the (2M−1)-th shift register unit is connected to the second clock signal line; and a first clock signal terminal of a (2M)-th shift register unit is connected to the second clock signal line, a second clock signal terminal of the (2M)-th shift register unit is connected to the first clock signal line, a first reset terminal of the (2M)-th shift register unit is connected to the first clock signal line; both N and M are positive integers, and N is greater than or equal to 2.

For example, in the gate drive circuit provided by some embodiments of the present disclosure, in a case where the reset signal control circuit of the shift register unit is connected to a reset control input terminal, except for a last shift register unit of the plurality of shift register units, a reset control input terminal of a L-th shift register unit is connected to an output terminal of a (L+1)-th shift register unit, a first reset terminal of the L-th shift register unit is connected to a second clock signal terminal of the (L+1)-th shift register unit, and L is an integer greater than 0.

At least some embodiments of the present disclosure also provide a display device, which includes the gate drive circuit provided by any one of embodiments of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
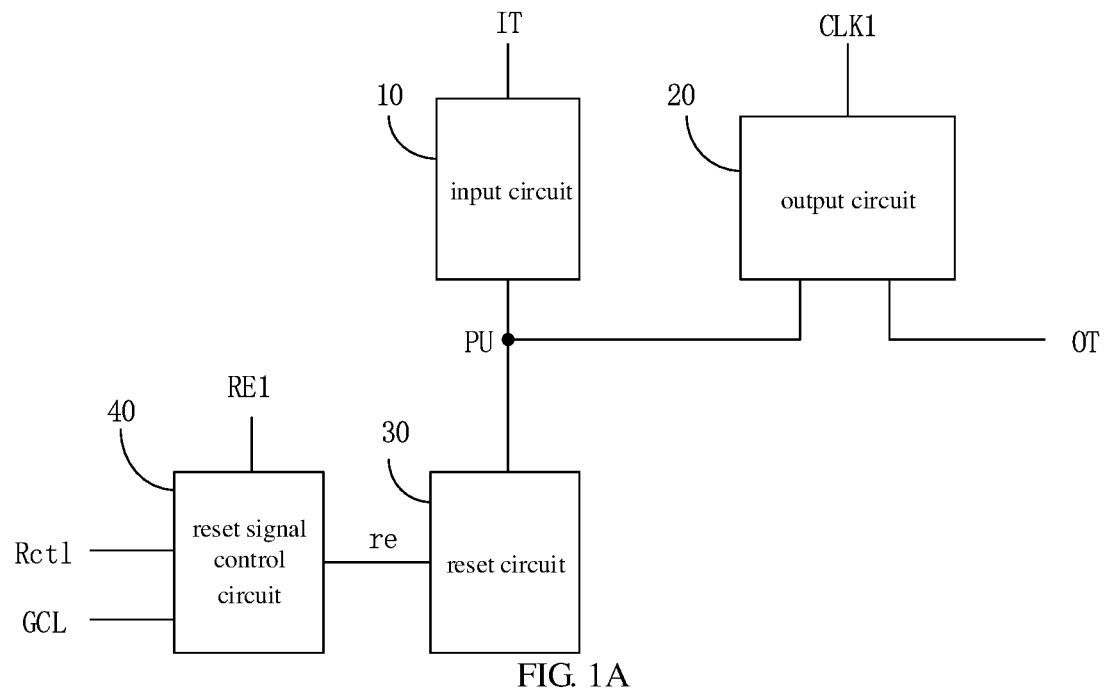
FIG. 1A is a schematic block diagram of a shift register unit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiments of the present disclosure are described in detail below, examples of the embodiments are illustrated in the accompanying drawings, the same or similar reference numerals are used to refer to the same or similar elements or elements having the same or similar functions throughout. The embodiments described below with reference to the accompanying drawings are exemplary, are intended to explain the present disclosure, and should not be construed as limiting the present disclosure.

It should be noted that, in the embodiments of the present disclosure, for example, in a case where each circuit is implemented as N-type transistors, the term "pull-up" represents charging a node or an electrode of a transistor so as to increase an absolute value of a level of the node or the electrode of the transistor, thereby achieving an operation (e.g., a turn-on operation) of a corresponding transistor; the term "pull-down" represents discharging a node or an electrode of a transistor so that an absolute value of a level of the node or the electrode of the transistor is decreased, thereby achieving an operation (e.g., a turn-off operation) of a corresponding transistor. For another example, in a case where each circuit is implemented as P-type transistors, the term "pull-up" means discharging a node or an electrode of a transistor so that an absolute value of a level of the node or the electrode of the transistor is decreased, thereby achieving an operation (e.g., a turn-on operation) of the corresponding transistor; and the term "pull-down" means to charge a node or an electrode of a transistor so that an absolute value of a level of the node or the electrode of the transistor is increased, thereby achieving an operation (e.g., a turned-off operation) of a corresponding transistor.

At least some embodiments of the present disclosure provide a shift register unit and a driving method thereof, a gate drive circuit and a display device. The shift register unit includes: an input circuit, connected to a pull-up node, and configured to charge the pull-up node according to an input signal; an output circuit, connected to the pull-up node and an output terminal respectively, and configured to output an output signal to the output terminal under control of a voltage of the pull-up node; a reset circuit, connected to the pull-up node, and configured to reset the pull-up node; and a reset signal control circuit, connected to a first reset terminal and the reset circuit respectively, and configured to generate and output a reset control signal according to a reset control input signal and a reset signal provided by the first reset terminal. The reset control signal is configured to control the reset circuit to perform a reset operation.

The shift register unit generates a reset control signal, which is used to replace an output signal of a next stage shift register unit cascaded with the shift register unit originally, according to a reset control input signal (e.g., an output signal) and a reset signal through a reset signal control circuit, so that the reset of the shift register unit can be achieved without the cascaded output signal, the mutual influence among the shift register units is weakened, in a case where a single shift register unit is abnormal, the abnormality of a plurality of shift register units is not caused, and an abnormal position can be quickly positioned.

A shift register unit and a driving method thereof, a gate drive circuit, and a display device provided by an embodiment of the present disclosure will be described below with reference to the accompanying drawings.

Figure 1B:
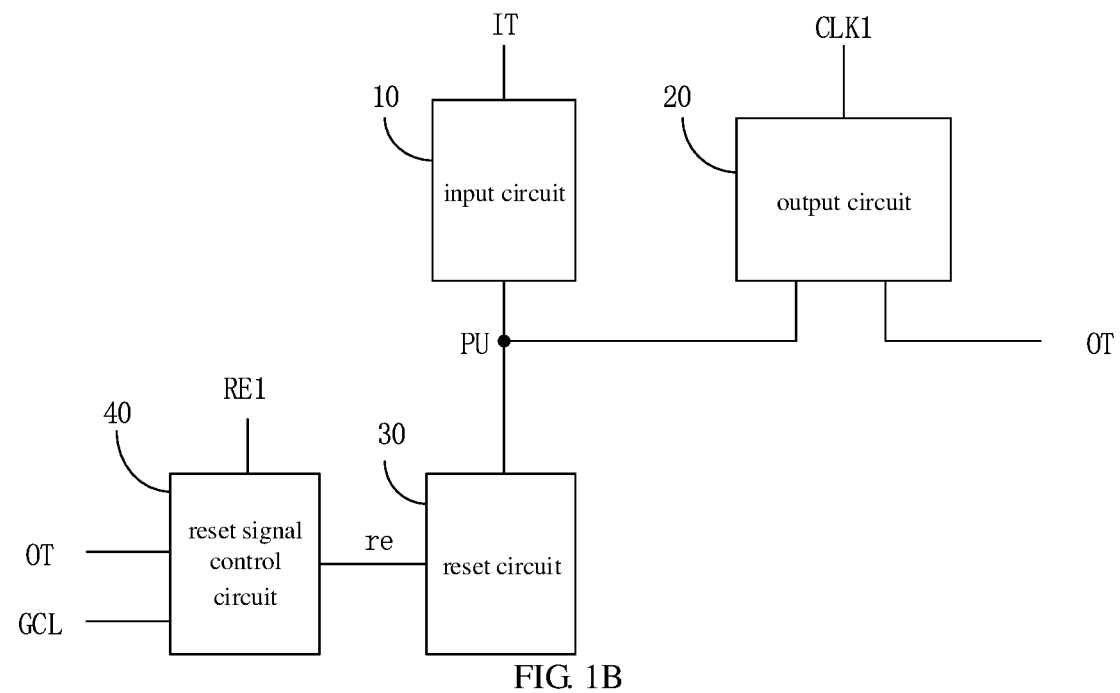
FIG. 1B is a schematic block diagram of another shift register unit provided by some embodiments of the present disclosure.
Figure 1C:
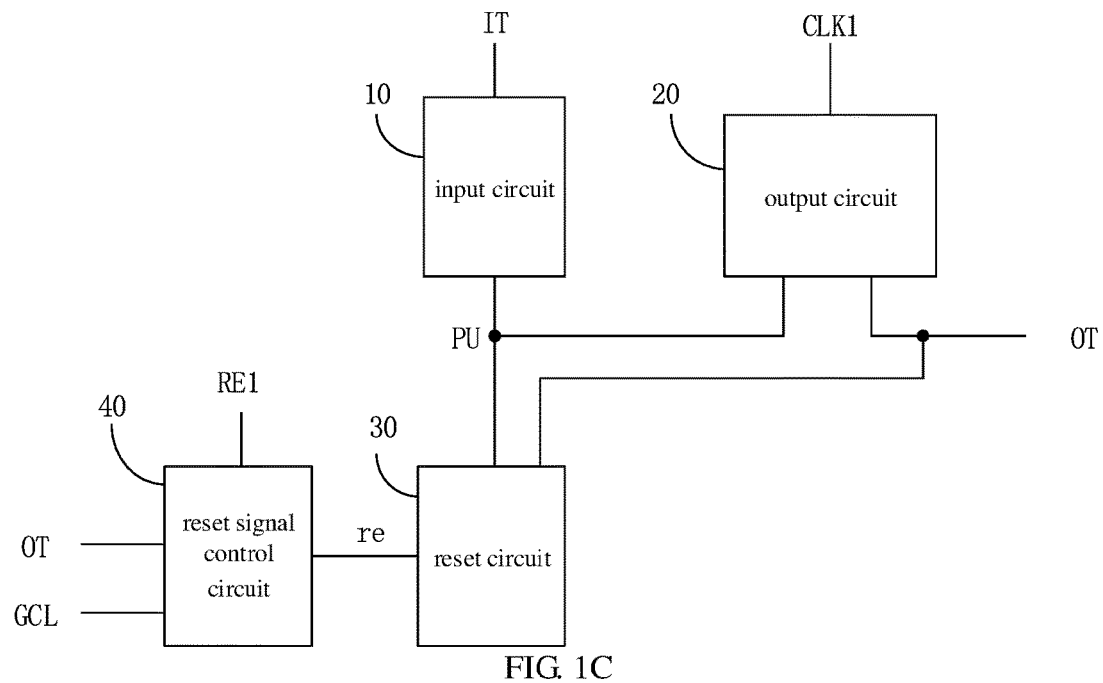
FIG. 1C is a schematic block diagram of yet another shift register unit provided by some embodiments of the present disclosure.
Figure 1D:
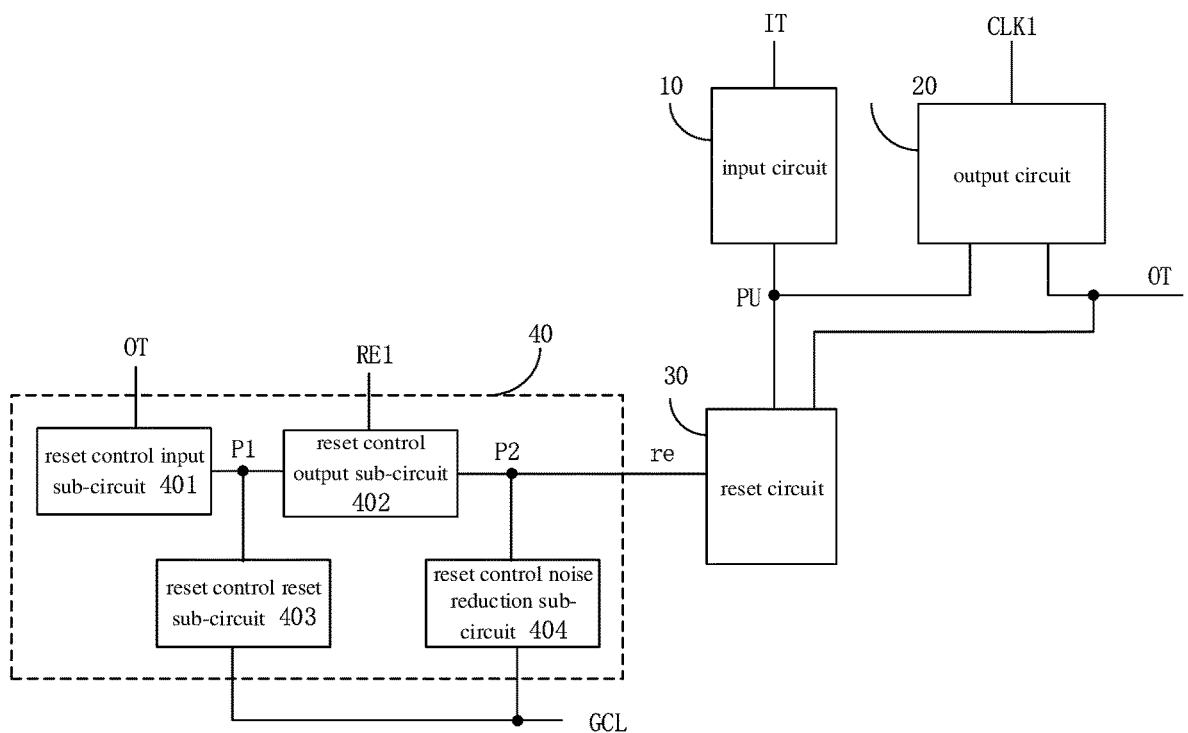
FIG. 1D is a schematic block diagram of still another shift register unit provided by some embodiments of the present disclosure.

FIG. 1A is a schematic block diagram of a shift register unit provided by some embodiments of the present disclosure, FIG. 1B is a schematic block diagram of another shift register unit provided by some embodiments of the present disclosure, FIG. 1C is a schematic block diagram of yet another shift register unit provided by some embodiments of the present disclosure, and FIG. 1D is a schematic block diagram of still another shift register unit provided by some embodiments of the present disclosure.

As shown in FIG. 1A, the shift register unit of an embodiment of the present disclosure may include an input circuit 10, an output circuit 20, a reset circuit 30, and a reset signal control circuit 40.

For example, the input circuit 10 is connected to an input terminal IT and a pull-up node PU, and is configured to charge the pull-up node PU according to an input signal provided by the input terminal IT to pull up a potential of the pull-up node PU to a an operation potential. The output circuit 20 is respectively connected to the pull-up node PU and an output terminal OT, and is configured to output an output signal to the output terminal OT under control of a voltage of the pull-up node PU. The reset circuit 30 is connected to the pull-up node PU, and is configured to reset the pull-up node PU. The reset signal control circuit 40 is respectively connected to a first reset terminal RE1 and the reset circuit 30, and is configured to generate and output a reset control signal re according to a reset control input signal and a reset signal provided by the first reset terminal RE1 and control the reset circuit 30 to perform a reset operation according to the reset control signal re, that is, the reset control signal re is configured to control the reset circuit 30 to perform the reset operation.

For example, the reset control signal re may be output to the reset circuit 30 to control the turn-on and the turn-off of the reset circuit 30. In a case where the reset circuit 30 is turned on under control of the reset control signal re, the pull-up node PU can be reset.

For example, as shown in FIG. 1A, in some embodiments, the shift register unit further includes a reset control input terminal Rctl, and the reset signal control circuit 40 is further connected to the reset control input terminal Rctl to receive the reset control input signal. As shown in FIG. 1B, in other examples, the reset signal control circuit 40 is also connected to the output terminal OT to receive the output signal as the reset control input signal, that is, the reset signal control circuit 40 may be a self-reset control circuit. A structure of the shift register unit as shown in FIG. 1A is similar to a structure of the shift register unit as shown in FIG. 1B, except that: compared with the shift register unit as shown in FIG. 1A, the shift register unit as shown in FIG. 1B uses the output signal of the current stage shift register unit as the reset control input signal to achieve a self-reset function.

All of current GOA models adopt cascade models, that is, except for a first stage shift register unit and a last stage shift register unit, an output signal of an output terminal of each intermediate stage shift register unit is used as both a reset signal of a previous stage shift register unit and an input signal of a next stage shift register unit. However, in a case where one of shift register units is abnormal, the normal operation of previous multi-stage shift register units and next multi-stage shift register units of the abnormal shift register unit will be affected, which can cause serious problems of poor display.

For this reason, as shown in FIG. 1B, the present disclosure provides a shift register unit, which can perform reset control inside the shift register unit through the reset signal control circuit 40. The reset signal control circuit 40 takes both the output signal of the current stage shift register unit and the reset signal provided by the first reset terminal RE1 as input signals, and generates and outputs the reset control signal re according to the output signal and the reset signal provided by the first reset terminal RE1. The reset control signal re replaces an output signal of an original cascade next stage shift register unit as a signal for controlling the reset circuit 30 to perform a reset operation, and the reset circuit 30 resets the voltage of the pull-up node PU according to the reset control signal re, thereby achieving the self-reset function of the current stage shift register unit. Therefore, the shift register unit of the embodiments of the present disclosure does not need to adopt the output signal of the cascaded shift register unit as the reset signal, and can achieve to reset the current stage shift register unit through the output signal of the current stage shift register unit, so that the mutual influence among the shift register units is weakened, in a case where a single shift register unit is abnormal, the abnormality of a plurality of shift register units is not caused, and an abnormal position can be quickly positioned.

For example, as shown in FIG. 1C, in some embodiments, the reset circuit 30 may also be connected to the output terminal OT of the shift register unit, and may also be configured to reset the output terminal OT under control of the reset control signal re. The structure of the shift register unit as shown in FIG. 1B is similar to a structure of the shift register unit as shown in FIG. 1C, except that: compared with the shift register unit as shown in FIG. 1B, the reset circuit 30 of the shift register unit as shown in FIG. 1C is also connected to the output terminal OT to reset the output terminal OT.

According to some embodiments of the present disclosure, as shown in FIGS. 1A-1C, the reset signal control circuit 40 is further connected to a total reset terminal GCL, and is further configured to stop outputting the reset control signal re according to a total reset signal provided by the total reset terminal GCL. For example, the total reset terminal GCL is used to output an effective total reset signal after the end of each frame time, to control the reset signal control circuit 40 of the shift register unit to stop outputting the reset control signal re.

For example, as shown in FIGS. 1A-1C, in some embodiments, the output circuit 20 is further connected to a first clock signal terminal CLK1, and is configured to generate an output signal according to a first clock signal provided by the first clock signal terminal CLK1 under control of the voltage of the pull-up node PU. For example, in a case where the output circuit 20 is turned on, the output circuit 20 outputs the first clock signal to the output terminal OT as the output signal.

For example, as shown in FIG. 1D, the reset signal control circuit 40 includes a reset control input sub-circuit 401, a reset control output sub-circuit 402, and a reset control reset sub-circuit 403.

For example, as shown in FIG. 1D, the reset control input sub-circuit 401 is connected to a first node P1, and is configured to charge the first node P1 according to the reset control input signal; the reset control output sub-circuit 402 is respectively connected to the first reset terminal RE1, the first node P1 and a second node P2, and is configured to generate and output the reset control signal re to the second node P2 according to the reset signal provided by the first reset terminal RE1 under control of a voltage of the first node P1; and the reset control reset sub-circuit 403 is connected to the first node P1 and the total reset terminal GCL, and is configured to reset the first node P1 under control of the total reset signal provided by the total reset terminal GCL.

For example, as shown in FIG. 1D, in some examples, the reset signal control circuit 40 further includes a reset control noise reduction sub-circuit 404. The reset control noise reduction sub-circuit 404 is connected to the second node P2 and the total reset terminal GCL, and is configured to perform denoising on the second node P2 under control of the total reset signal provided by the total reset terminal GCL.

A structure of the shift register unit provided by the embodiments of the present disclosure will be described in detail below by taking the shift register unit shown in FIG. 1D as an example.

Figure 2:
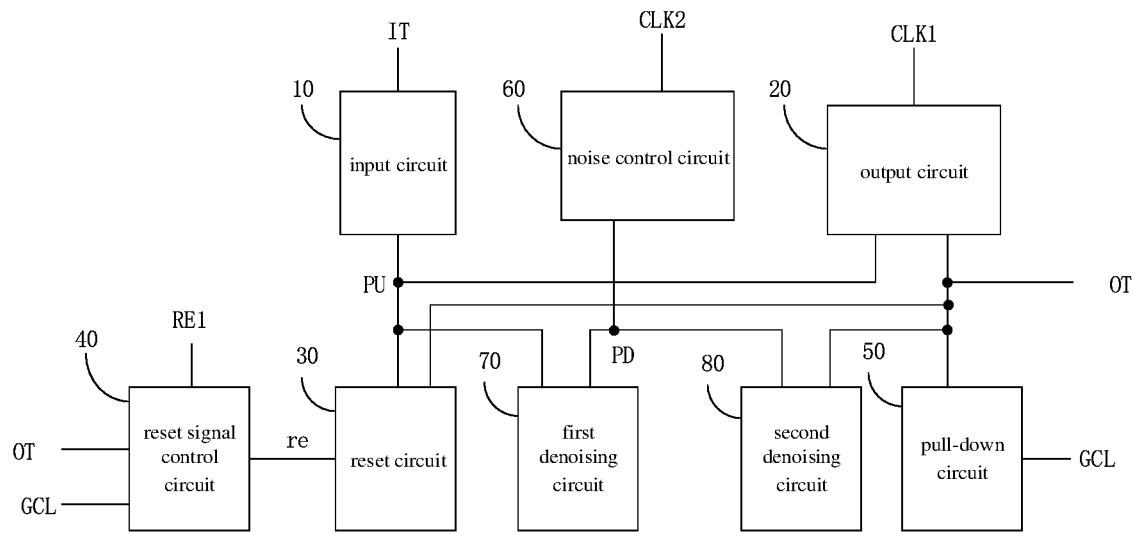
FIG. 2 is a schematic block diagram of a shift register unit provided by other embodiments of the present disclosure.
Figure 3:
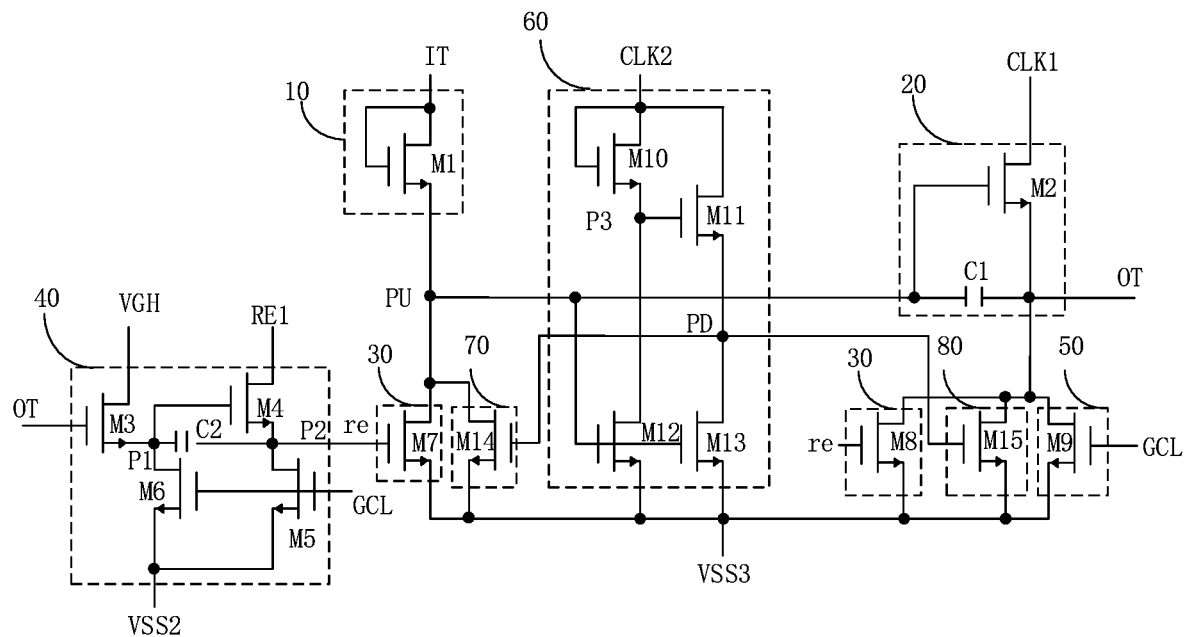
FIG. 3 is a circuit structure schematic diagram of a shift register unit provided by some embodiments of the present disclosure.

FIG. 2 is a schematic block diagram of a shift register unit provided by other embodiments of the present disclosure, and FIG. 3 is a circuit structure schematic diagram of a shift register unit provided by some embodiments of the present disclosure. The shift register unit as shown in FIG. 2 is an example of the shift register unit as shown in FIG. 1D.

According to an embodiment of the present disclosure, as shown in FIG. 2, the shift register unit further includes a pull-down circuit 50, a noise control circuit 60, a first denoising circuit 70, and a second denoising circuit 80.

For example, the pull-down circuit 50 is respectively connected to the output terminal OT and the total reset terminal GCL, and is configured to reset the output terminal OT according to the total reset signal provided by the total reset terminal GCL. The noise control circuit 60 is connected to a second clock signal terminal CLK2 and a pull-down node PD, respectively, and is configured to pull up a voltage of the pull-down node PD according to a second clock signal provided by the second clock signal terminal CLK2. The first denoising circuit 70 is connected to the pull-down node PD and the pull-up node PU, respectively, and is configured to perform denoising on the voltage of the pull-up node PU under control of the voltage of the pull-down node PD. The second denoising circuit 80 is respectively connected to the pull-down node PD and the output terminal OT, and is configured to perform denoising on the output terminal OT under control of the voltage of the pull-down node PD.

For example, the reset signal provided by the first reset terminal RE1 may be a multi-output signal, for example, may be a clock signal, i.e., the reset signal includes a plurality of effective sub-signals. Under control of the effective sub-signals, the reset signal control circuit 40 outputs the reset control signal re to the reset circuit 30. The reset signal also includes a plurality of ineffective sub-signals. Under control of the ineffective sub-signals, the reset signal control circuit 40 cannot output the reset control signal re. For example, the effective sub-signals may be high level signals while the ineffective sub-signals is low level signals.

For example, in some embodiments, the reset signal may be the second clock signal provided by the second clock signal terminal CLK2.

In the following description, the embodiments of the present disclosure are described by taking a case that each transistor is an N-type transistor as an example, but the embodiments of the present disclosure are not limited to this case. In the embodiments of the present disclosure, at least part of the transistors may also be P-type transistors.

According to an embodiment of the present disclosure, as shown in FIG. 3, the input circuit 10 includes a first transistor M1, a first terminal of the first transistor M1 is connected to a control terminal of the first transistor M1 and then connected to the input terminal IT, and a second terminal of the first transistor M1 is connected to the pull-up node PU. The input terminal IT is configured to provide the input signal. In a case where the input signal controls the first transistor M1 to be turned on, the first transistor M1 inputs the input signal to the pull-up node PU.

For example, the input circuit 10 may be implemented as a transistor, i.e., the first transistor M1, and the first transistor M1 may be an NMOS transistor. In a case where the input signal provided by the input terminal IT is at a high level, the first transistor M1 is turned on, and the input signal is input to the pull-up node PU, thereby charging the pull-up node PU, so that the voltage of the pull-up node PU becomes at a high level.

According to an embodiment of the present disclosure, as shown in FIG. 3, the output circuit 20 includes a second transistor M2 and a first capacitor C1. A first terminal of the second transistor M2 is connected to the first clock signal terminal CLK1, a control terminal of the second transistor M2 is connected to the pull-up node PU, and a second terminal of the second transistor M2 is connected to the output terminal OT of the shift register unit, for example, the second terminal of the second transistor M2 can be used as the output terminal OT of the shift register unit; and a first terminal of the first capacitor C1 is connected to the control terminal of the second transistor M2, and a second terminal of the first capacitor C1 is connected to the second terminal of the second transistor M2.

For example, the output circuit 20 may be implemented as a transistor (i.e., the second transistor M2) and an energy storage unit (i.e., the first capacitor C1), the transistor of the output circuit 20 may be an NMOS transistor, and the energy storage unit of the output circuit 20 may be a capacitor. In a case where the voltage of the pull-up node PU is at a high level, the second transistor M2 is turned on, and the second transistor M2 outputs the first clock signal provided by the first clock signal terminal CLK1 to the output terminal OT of the shift register unit, that is, the output terminal OT of the shift register unit outputs the first clock signal. In a case where the first clock signal provided by the first clock signal terminal CLK1 is a high level signal, the output signal of the output terminal OT of the shift register unit is a high level signal, and in a case where the first clock signal provided by the first clock signal terminal CLK1 changes from a high level signal to a low level signal, the output signal of the output terminal OT of the shift register unit becomes a low level signal, and the output of the shift register unit is completed at this time.

It should be noted that, in various embodiments of the present disclosure, the first capacitor C1 may be a capacitor device manufactured by a process, for example, by manufacturing a special capacitor electrode to implement the capacitor device, and each electrode of the capacitor may be achieved by a metal layer, a semiconductor layer (e.g., doped polysilicon), or the like. The first capacitor C1 may also be a parasitic capacitor between various devices, and may be achieved by the transistor itself and other devices and circuits.

According to an embodiment of the present disclosure, as shown in FIG. 3, the reset control input sub-circuit 401 includes a third transistor M3, the reset control output sub-circuit 402 includes a fourth transistor M2 and a second capacitor C2, the reset control noise reduction sub-circuit 404 includes a fifth transistor M5, and the reset control reset sub-circuit 403 includes a sixth transistor M6.

For example, a first terminal of the third transistor M3 is connected to a first preset power supply VGH, a second terminal of the third transistor M3 is connected to the first node P1, and a control terminal of the third transistor M3 is configured to receive the reset control input signal. As shown in FIG. 3, in some examples, the control terminal of the third transistor M3 is connected to the output terminal OT of the shift register unit to receive the output signal as the reset control input signal.

For example, a first terminal of the fourth transistor M4 is connected to the first reset terminal RE1, a second terminal of the fourth transistor M4 is connected to the second node P2, and a control terminal of the fourth transistor M4 is connected to the first node P1, that is, the control terminal of the fourth transistor M4 is connected to the second terminal of the third transistor M3; and a first terminal of the second capacitor C2 is connected to the first node P1, and a second terminal of the second capacitor C2 is connected to the second node P2, that is, the second terminal of the second capacitor C2 is connected to the second terminal of the fourth transistor M4.

For example, a first terminal of the fifth transistor M5 is connected to the second node P2, a second terminal of the fifth transistor M5 is connected to a second preset power supply VSS2, and a control terminal of the fifth transistor M5 is connected to the total reset terminal GCL; and a control terminal of the sixth transistor M6 is connected to the total reset terminal GCL, a first terminal of the sixth transistor M6 is connected to the first node P1, and a second terminal of the sixth transistor M6 is connected to the second preset power supply VSS2.

For example, the second node P2 may serve as an output terminal of the reset signal control circuit 40.

For example, the reset signal control circuit 40 may be implemented as four transistors and an energy storage unit, each transistor in the reset signal control circuit 40 may be an NMOS transistor, and the energy storage unit may be a capacitor. A voltage output by the first preset power supply VGH is a DC high level voltage, and a voltage output by the second preset power supply VSS2 is a DC low level voltage. In a case where the output signal of the output terminal OT of the shift register unit is a high level signal, the third transistor M3 is turned on, and the voltage output by the first preset power supply VGH is written into the first node P1, thereby charging the first node P1 to pull up a potential of the first node P1 to an operation potential (e.g., a high potential), and the fourth transistor M4 is turned on under control of the first node P1. In a process when the fourth transistor T4 is turned on, in a case where the reset signal provided by the first reset terminal RE1 is at a high level (i.e., an effective sub-signal), the effective sub-signal is written into the second node P2 as the reset control signal re, and the second node P2 is at a high level. At this time, the reset control signal re is also a high level signal, and the reset circuit 30 resets the pull-up node PU according to the reset control signal re, thereby achieving the self-reset function of the shift register unit. The reset control signal re output by the reset signal control circuit 40 can replace an output signal of an original cascade next stage shift register unit to achieve to control the reset circuit 30 to perform the reset operation.

In addition, after the end of one frame time, in a case where the total reset signal provided by the total reset terminal GCL is at a high level, under control of the total reset signal, the sixth transistor M6 is turned on, thereby transmitting the voltage output by the second preset power supply VSS2 to the first node P1 to discharge the first node P1, so that the voltage of the first node P1 becomes a low level voltage, and the fourth transistor M4 is turned off. Meanwhile, under control of the total reset signal, the fifth transistor M5 is also turned on, thereby transmitting the voltage output by the second preset power supply VSS2 to the second node P2 to discharge the second node P2. At this time, the voltage of the second node P2 becomes a low level voltage, i.e., the reset signal control circuit 40 stops outputting the reset control signal re, and at this time, the reset circuit 30 ends the reset operation. In a case where the next frame time starts, the pull-up node PU can be recharged by the input circuit 10.

It should be noted that in the embodiments of the present disclosure, the "reset control signal re" may represent a signal that can control the reset circuit 30 to perform the reset operation, that is, in a case where the reset circuit 30 receives the reset control signal re, the reset circuit 30 is turned on, thereby resetting the pull-up node PU and the output terminal OT. In a case where the reset control signal re is a high level signal, the operation that "the reset signal control circuit 40 stops outputting the reset control signal re" may indicate that the reset signal control circuit 40 stops outputting the high level signal, but at this time, the reset signal control circuit 40 may output a low level signal, or the reset signal control circuit 40 may also not output a signal. Accordingly, in a case where the reset control signal re is a low level signal, the operation that "the reset signal control circuit 40 stops outputting the reset control signal re" may indicate that the reset signal control circuit 40 stops outputting the low level signal, but at this time, the reset signal control circuit 40 may output a high level signal, or the reset signal control circuit 40 may also not output a signal.

In addition, the reset signal provided by the first reset terminal RE1 may be a multi-output signal, that is, the reset signal include a plurality of effective sub-signals, for example, the reset signal may be a second clock signal provided by the second clock signal terminal CLK2. During one frame time, the fourth transistor M4 is turned on all the time due to the effect of the second capacitor C2. In a process when the fourth transistor M4 is turned on, the reset signal control circuit 40 outputs the reset control signal re whenever the reset signal provided by the first reset terminal RE1 is at a high level (e.g., an effective sub-signal), so as to control the reset circuit 30 to discharge the pull-up node PU for once, thereby achieving to discharge the pull-up node PU several times in one frame time and effectively preventing the Multi-out (a plurality of rows simultaneously output) caused by residual charges.

For example, the first reset terminal RE1 may provide a corresponding reset signal by a separate reset signal line. For example, a signal output by TCON (clock controller) is transmitted to the first reset terminal RE1 via LS (Level Shift chip); and the first reset terminal RE1 may also be connected to the second clock signal terminal CLK2 to share the second clock signal with the second clock signal terminal CLK2, thereby reducing the use of signal lines and further reducing an occupied area of the shift register unit.

According to an embodiment of the present disclosure, as shown in FIG. 3, the reset circuit 30 includes a seventh transistor M7 and an eighth transistor M8. The seventh transistor M7 is used to reset the pull-up node PU, and the eighth transistor M8 is used to reset the output terminal OT.

For example, a control terminal of the seventh transistor M7 is connected to the reset signal control circuit 40 to receive the reset control signal. For example, the control terminal of the seventh transistor M7 is connected to the second node P2, a first terminal of the seventh transistor M7 is connected to the pull-up node PU, and a second terminal of the seventh transistor M7 is connected to a third preset power supply VSS3. A first terminal of the eighth transistor M8 is connected to the output terminal OT of the shift register unit, a control terminal of the eighth transistor M8 is connected to the second node P2, and a second terminal of the eighth transistor M8 is connected to the third preset power supply VSS3.

For example, the reset circuit 30 may be implemented as two transistors (i.e., the seventh transistor M7 and the eighth transistor M8), and each transistor in the reset circuit 30 may be an NMOS transistor. In combination with the reset signal control circuit 40, in a case where the output signal of the output terminal OT of the shift register unit is at a high level, the third transistor M3 is turned on to charge the first node P1. Under control of the first node P1, the fourth transistor M4 is turned on. In a process when the fourth transistor M4 is turned on, when the reset signal provided by the first reset terminal RE1 is at a high level, the reset signal control circuit 40 outputs the reset control signal re. Under control of the reset control signal re, the seventh transistor M7 is turned on, and the voltage output by the third preset power supply VSS3 is written into the pull-up node PU, thereby discharging the pull-up node PU, and the voltage of the pull-up node PU becomes a low level voltage to turn off the second transistor M2. Meanwhile, under control of the reset control signal re, the eighth transistor M8 is also turned on, and the voltage output by the third preset power supply VSS3 is written into the output terminal OT to discharge the output terminal OT, so that the output terminal OT of the shift register unit is pulled down to a low level to reset the output terminal OT. Therefore, the reset control signal re output by the reset signal control circuit 40 replaces an output signal of an original cascade next stage shift register unit, so that the reset circuit 30 can reset the pull-up node PU and reset the output terminal OT according to the reset control signal re, thereby achieving the self-reset function of the shift register unit.

For example, the voltage output by the third preset power supply VSS3 is a DC low level voltage. For example, the second preset power supply VSS2 and the third preset power supply VSS3 may be the same power supply or output the same DC low level voltage.

For example, in a case where both the seventh transistor M7 and the eighth transistor M8 are N-type transistors, the reset control signal re is a high level signal; and in a case where both the seventh transistor M7 and the eighth transistor M8 are P-type transistors, the reset control signal re is a low level signal.

In addition, after the end of one frame time, in a case where the total reset signal provided by the total reset terminal GCL is a high level signal, under control of the total reset signal, the sixth transistor M6 is turned on, thereby transmitting the voltage output by the second preset power supply VSS2 to the first node P1 to discharge the first node P1, so that the voltage of the first node P1 becomes a low level voltage, and the fourth transistor M4 is turned off. At the same time, under control of the total reset signal, the fifth transistor M5 is also turned on, thereby transmitting the voltage output by the second preset power supply VSS2 to the second node P2 to discharge the second node P2. At this time, the voltage of the second node P2 becomes a low level voltage, that is, the reset signal control circuit 40 stops outputting the reset control signal re, both the seventh transistor M7 and the eighth transistor M8 are turned off, and the reset operation is completed.

In addition, the reset signal provided by the first reset terminal RE1 may be a multi-output signal, i.e., may include a plurality of effective sub-signals. During one frame time, due to the effect of the second capacitor C2, the fourth transistor M4 may be turned on all the time. Whenever the reset signal provided by the first reset terminal RE1 is at a high level (e.g., an effective sub-signal), the reset signal control circuit 40 may output the reset control signal re to control the seventh transistor M7 to discharge the pull-up node PU for once, thereby achieving to discharge the pull-up node PU several times in one frame time and effectively preventing the Multi-out caused by residual charges. At the same time, the reset control signal re can also control the eighth transistor M8 to discharge the output terminal OT for once, so as to achieve to reset the output terminal OT for several times in one frame time and ensure the stability of the output.

According to an embodiment of the present disclosure, as shown in FIG. 3, the pull-down circuit 50 includes a ninth transistor M9, a first terminal of the ninth transistor M9 is connected to the output terminal OT of the shift register unit, a control terminal of the ninth transistor M9 is connected to the total reset terminal GCL, and a second terminal of the ninth transistor M9 is connected to the third preset power supply VSS3.

For example, the pull-down circuit 50 may be implemented as one transistor (i.e., ninth transistor M9), and the ninth transistor M9 may be an NMOS transistor. After the end of one frame time, in a case where the total reset signal provided by the total reset terminal GCL is at a high level, the ninth transistor M9 is turned on to transmit the voltage output by the third preset power supply VSS3 to the output terminal OT, so that the output terminal OT of the shift register unit outputs a DC low level voltage, that is, the voltage output by the output terminal OT is a low level voltage to reset the output terminal OT, thereby achieving the total reset function of the shift register unit. That is, the total reset signal provided by the total reset terminal GCL is a total reset signal after the end of each frame time, to reset all shift register units in the gate drive circuit, and controls the reset signal control circuit 40 to stop outputting the reset control signal re to control the reset circuit 30 to finish the reset operation.

According to an embodiment of the present disclosure, as shown in FIG. 3, the noise control circuit 60 includes a tenth transistor M10, an eleventh transistor M11, a twelfth transistor M12, and a thirteenth transistor M13. A first terminal of the tenth transistor M10 is connected to a control terminal of the tenth transistor M10 and then connected to the second clock terminal signal terminal CLK2, and a second terminal of the tenth transistor M10 is connected to a third node P3. A first terminal of the eleventh transistor M11 is connected to the second clock signal terminal CLK2, a control terminal of the eleventh transistor M11 is connected to the third node P3, and a second terminal of the eleventh transistor M11 is connected to the pull-down node PD. A first terminal of the twelfth transistor M12 is connected to the third node P3, a control terminal of the twelfth transistor M12 is connected to the pull-up node PU, and a second terminal of the twelfth transistor M12 is connected to the third preset power supply VSS3. A first terminal of the thirteenth transistor M13 is connected to the pull-down node PD, a control terminal of the thirteenth transistor M13 is connected to the pull-up node PU, and a second terminal of the thirteenth transistor M13 is connected to the third preset power supply VSS3.

For example, the noise control circuit 60 may be implemented as four transistors, and each transistor of the noise control circuit 60 may be an NMOS transistor. In a case where the pull-up node PU is at a high level, the thirteenth transistor M13 is turned on to transmit the voltage output by the third preset power supply VSS3 to the pull-down node PD, so that the pull-down node PD is at a low level. At this time, both the first denoising circuit 70 and the second denoising circuit 80 are turned off, so that both the first denoising circuit 70 and the second denoising circuit 80 do not perform denoising processing on the pull-up node PU and the output terminal OT. Meanwhile, under control of the pull-up node PU, the twelfth transistor M12 is also turned on to transmit the voltage output by the third preset power supply VSS3 to the control terminal of the eleventh transistor M11, so that the control terminal of the eleventh transistor M11 is at a low level. Even if the second clock signal provided by the second clock signal terminal CLK2 is at a high level at this time, by reasonably designing a channel width-to-length ratio of the tenth transistor M10 and the twelfth transistor M12, that is, a channel width of the twelfth transistor M12 is much larger than a channel width of the tenth transistor M10, so that a discharge speed of the third node P3 in a case where the twelfth transistor M12 is turned on is much larger than a charge speed of the third node P3 in a case where the tenth transistor M10 is turned on, thus ensuring that the third node P3 is at a low level, and the eleventh transistor M11 is turned off.

In a case where the pull-up node PU is at a low level, both the twelfth transistor M12 and the thirteenth transistor M13 are turned off. In a case where the second clock signal provided by the second clock signal terminal CLK2 is at a high level, the tenth transistor M10 is turned on, and the second clock signal is written to the third node P3 via the tenth transistor M10. At this time, the third node P3 is at a high level, so that the eleventh transistor M11 is also turned on. The second clock signal is written to the pull-down node PD via the eleventh transistor M11, so that the pull-down node PD is at a high level. At this time, both the first denoising circuit 70 and the second denoising circuit 80 are turned on, so that the first denoising circuit 70 and the second denoising circuit 80 perform denoising processing on the pull-up node PU and the output terminal OT.

According to an embodiment of the present disclosure, as shown in FIG. 3, the first denoising circuit 70 includes a fourteenth transistor M14, a first terminal of the fourteenth transistor M14 is connected to the pull-up node PU, a control terminal of the fourteenth transistor M14 is connected to the pull-down node PD, and a second terminal of the fourteenth transistor M14 is connected to the third preset power supply VSS3.

For example, the first denoising circuit 70 may be implemented as a transistor, i.e., a fourteenth transistor M14, and the fourteenth transistor M14 may be an NMOS transistor. In combination with the noise control circuit 60, in a case where the pull-up node PU is at a high level, the thirteenth transistor M13 is turned on to transmit the voltage output by the third preset power supply VSS3 to the pull-down node PD, so that the pull-down node PD is at a low level. Under control of the pull-down node PD, the fourteenth transistor M14 is turned off, and the pull-up node PU is not performed denoising at this time. In a case where the pull-up node PU is at a low level, the thirteenth transistor M13 is turned off. In a case where the second clock signal provided by the second clock signal terminal CLK2 is at a high level, both the tenth transistor M10 and the eleventh transistor M11 are turned on. The second clock signal is written to the pull-down node PD via the eleventh transistor M11, so that the pull-down node PD is at a high level, and the fourteenth transistor M14 is turned on. Therefore, the voltage output by the third preset power supply VSS3 is transmitted to the pull-up node PU, so that the pull-up node PU is always at a low level, thereby achieving to perform denoising on the pull-up node PU, ensuring that the second transistor M2 is turned off, so that the output signal of the output terminal OT is not affected by crosstalk of the first clock signal provided by the first clock signal terminal CLK1.

According to an embodiment of the present disclosure, as shown in FIG. 3, the second denoising circuit 80 includes a fifteenth transistor M15, a first terminal of the fifteenth transistor M15 is connected to the output terminal OT of the shift register unit, a control terminal of the fifteenth transistor M15 is connected to the pull-down node PD, and a second terminal of the fifteenth transistor M15 is connected to the third preset power supply VSS3.

For example, the second denoising circuit 80 may be implemented as a transistor, that is, the fifteenth transistor M15, and the fifteenth transistor M15 may be an NMOS transistor. In combination with the noise control circuit 60, in a case where the pull-up node PU is at a high level, the thirteenth transistor M13 is turned on to transmit the voltage output by the third preset power supply VSS3 to the pull-down node PD, so that the pull-down node PD is at a low level, the fifteenth transistor M15 is turned off, and the output terminal OT is not performed denoising at this time. In a case where the pull-up node PU becomes at a low level, the thirteenth transistor M13 is turned off. In a case where the second clock signal provided by the second clock signal terminal CLK2 is at a high level, both the tenth transistor M10 and the eleventh transistor M11 are turned on. The second clock signal is written to the pull-down node PD via the eleventh transistor M11, so that the pull-down node PD is at a high level and the fifteenth transistor M15 is turned on, and therefore, the voltage output by the third preset power supply VSS3 is transmitted to the output terminal OT, so that the output terminal OT is always at a low level, thereby performing denoising on the output terminal OT and preventing the output signal of the output terminal OT from being affected by crosstalk of the first clock signal provided by the first clock signal terminal CLK1.

Figure 4:
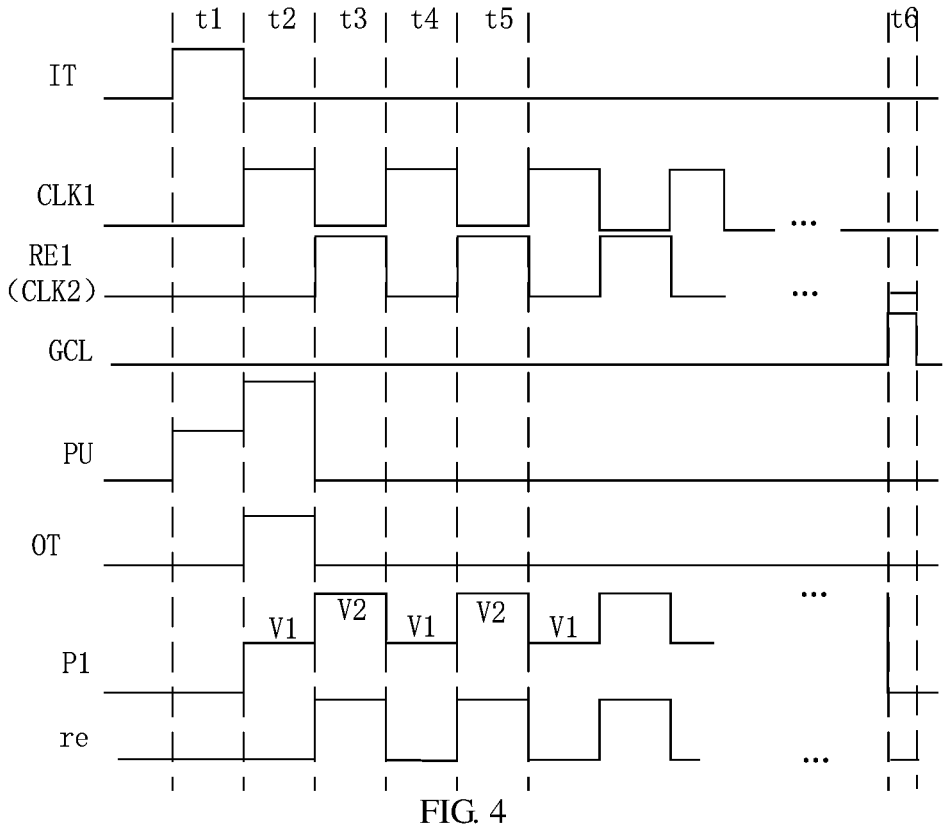
FIG. 4 is a timing chart of the shift register unit as shown in FIG. 3 in operation.

FIG. 4 is a timing chart of the shift register unit as shown in FIG. 3 in operation. The operation process of the shift register unit as shown in FIG. 3 will be described in detail below with reference to FIG. 4.

As shown in FIG. 4, both a duty ratio of the first clock signal provided by the first clock signal terminal CLK1 and a duty ratio of the reset signal provided by the first reset terminal RE1 are 50%, and the reset signal provided by the first reset terminal RE1 is identical to the second clock signal provided by the second clock signal terminal CLK2, that is, a duty ratio of the second clock signal provided by the second clock signal terminal CLK2 is also 50%.

For example, as shown in FIGS. 3 and 4, during a time t1, in a case where the input signal provided by the input terminal IT is at a high level, the first transistor M1 is turned on to charge the pull-up node PU, and the voltage of the pull-up node PU becomes a high level voltage, so that the second transistor M2 is turned on.

Then, in a case where the first clock signal provided by the first clock signal terminal CLK1 is at a high level, the output terminal OT of the shift register unit outputs a high level portion of the first clock signal provided by the first clock signal terminal CLK1, that is, the output signal of the shift register unit is at a high level during a time t2. Meanwhile, under a bootstrap effect of the first capacitor C1, the voltage of the pull-up node PU continues to rise, so that the second transistor M2 is more fully turned on. In this case, under control of the output signal, the third transistor M3 is turned on, the voltage output by the first preset power supply VGH is transmitted to the first node P1 to charge the first node P1, the voltage of the first node P1 becomes at a high level, and the fourth transistor M4 is turned on. Because the reset signal provided by the first reset terminal RE1 is at a low level at this time, the seventh transistor M7 cannot be turned on, and the voltage of the pull-up node PU is maintained at a high level. For example, during the time t2, the voltage of the first node P1 is represented as the first voltage V1.

For example, during a time t3, the first clock signal provided by the first clock signal terminal CLK1 becomes at a low level, and the output terminal OT of the shift register unit becomes at a low level, at this time, the shift register unit completes the output. Then, in a case where the reset signal provided by the first reset terminal RE1 becomes at a high level, the reset signal is output to the second node P2, i.e., the second node P2 changes from a low level to a high level. At this time, due to a bootstrap effect of the second capacitor C2, the voltage of the first node P1 continues to rise, the fourth transistor M4 maintains to be in a turn-on state and is more fully turned on. At this time, the reset signal control circuit 40 outputs the reset control signal re, the reset control signal re is a high level signal, the seventh transistor M7 is turned on, the pull-up node PU starts being discharged and returns to be at a low level, the second transistor M2 is turned off, and the shift register unit stops outputting. For example, during the time t3, the voltage of the first node P1 is represented as the second voltage V2.

For example, during a time t4, the reset signal provided by the first reset terminal RE1 becomes at a low level, and the reset signal is output to the second node P2, i.e., the second node P2 changes from a high level to a low level. At this time, due to the bootstrap effect of the second capacitor C2, the voltage of the first node P1 decreases and returns to be a voltage value during the time t2, i.e., the voltage of the first node P1 becomes the first voltage V1. At this time, although the fourth transistor M4 is still in a turn-on state, however, the reset signal control circuit 40 stops outputting the reset control signal re. At this time, the reset signal control circuit 40 outputs a low level signal, and the seventh transistor M7 is turned off to stop discharging the pull-up node PU.

For example, during a time t5, the reset signal provided by the first reset terminal RE1 becomes at a high level again, the reset signal control circuit 40 outputs the reset control signal re again, and the reset control signal re becomes a high level signal, the seventh transistor M7 is turned on, and the pull-up node PU is discharged again, so that the pull-up node PU can be repeatedly discharged in one frame time, for example, during the time t3, the pull-up node PU is discharged for the first time, and during the time t5, the pull-up node PU is discharged for the second time.

It should be noted that during the time t5, the voltage of the first node P1 rises due to the bootstrap effect of the second capacitor C2, and the voltage of the first node P1 becomes the second voltage V2 again.

For example, the total reset signal provided by the total reset terminal GCL is at a low level from the time t1 to the time t5. During a time t6, the total reset signal provided by the total reset terminal GCL becomes at a high level at the end time of a frame time (i.e., the end of the frame). At this time, the ninth transistor M9 is turned on to reset the output terminal OT of the shift register unit. Meanwhile, the sixth transistor M6 is turned on to discharge the first node P1, so that the first node P1 becomes at a low level and the fourth transistor M4 is turned off. The fifth transistor M5 is also turned off to discharge the second node P2, so that the second node P2 becomes at a low level. The reset signal control circuit 40 stops outputting the reset control signal re, that is, the reset signal control circuit 40 outputs a low level signal at this time, so that the reset circuit 30 stops resetting the pull-up node PU.

At the beginning of a next frame time, the pull-up node PU is charged again, and the above process from the time t1 to the time t6 is repeated.

It should be noted that in the above embodiments, the first transistor M1 to the fifteenth transistor M15 are all NMOS transistors, while in other embodiments of the present disclosure, the first transistor M1 to the fifteenth transistor M15 may also be PMOS transistors, and types of specific transistors are not limited herein.

According to the shift register unit of the embodiment of the disclosure, the input circuit charges the pull-up node according to the input signal provided by the input terminal, the output circuit outputs the output signal to the output terminal under control of the voltage of the pull-up node, the reset circuit resets the pull-up node and the output terminal, and the reset signal control circuit outputs the reset control signal according to the reset control input signal (e.g., the output signal) and the reset signal provided by the first reset terminal, and controls the reset circuit to perform the reset operation according to the reset control signal. Therefore, the reset signal control circuit outputs the reset control signal, which is used to replace an output signal of an original cascaded next stage shift register unit, according to the reset control input signal and the reset signal provided by the first reset terminal, so that the reset of the shift register unit can be achieved without the cascaded output signal, that is, the reset of the shift register unit is achieved through the reset control signal, the mutual influence among the shift register units is weakened, in a case where a single shift register unit is abnormal, the abnormality of a plurality of shift register units cannot be caused, and an abnormal position can be quickly positioned.

Figure 5:
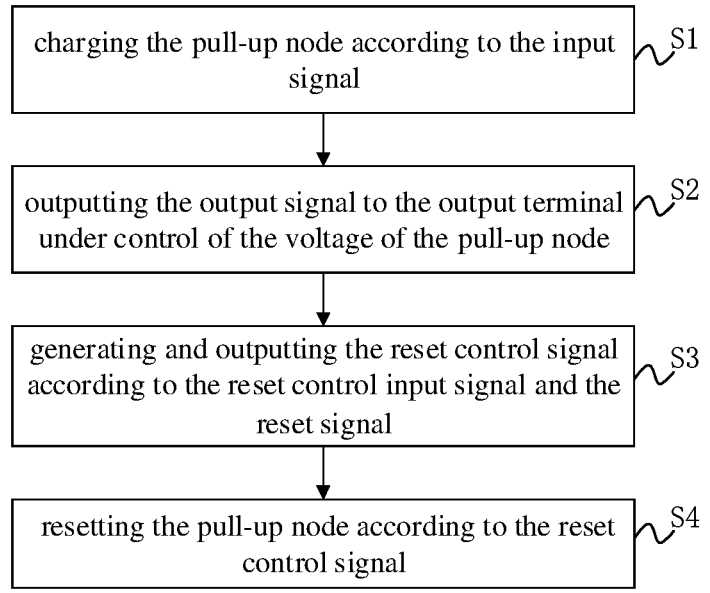
FIG. 5 is a flowchart of a driving method of a shift register unit provided by some embodiments of the present disclosure.

FIG. 5 is a flowchart of a driving method of some shift register units provided by some embodiments of the present disclosure. The driving method provided by the embodiments of the present disclosure can drive the shift register unit provided by any one of the above embodiments.

As shown in FIG. 5, the driving method of the shift register unit of the embodiments of the present disclosure may include the following steps:

S1: charging the pull-up node according to the input signal;

S2: outputting the output signal to the output terminal under control of the voltage of the pull-up node;

S3: generating and outputting the reset control signal according to the reset control input signal and the reset signal;

S4: resetting the pull-up node according to the reset control signal.

For example, in step S1, the input signal may be provided by the input terminal. Step S1 may include writing the input signal to the pull-up node to charge the pull-up node under control of the input signal.

For example, step S2 includes: generating the output signal according to the clock signal provided by the first clock signal terminal under control of the voltage of the pull-up node, and outputting the output signal to the output terminal of the shift register unit.

According to some embodiments of the present disclosure, the driving method of the shift register unit may further include: stopping outputting the reset control signal according to the total reset signal provided by the total reset terminal.

According to some embodiments of the present disclosure, the reset signal is a multi-output signal, i.e., the reset signal includes a plurality of effective sub-signals.

It should be noted that a detailed description of the driving method of the shift register unit according to the embodiments of the present disclosure can refer to the specific contents disclosed in the shift register unit of the embodiments of the present disclosure, and the repetition will not be repeated herein again.

For example, in step S3, in some embodiments, the reset control input signal may be the output signal of the current stage shift register unit, so that the shift register unit may implement a self-reset function. Therefore, according to the driving method of the shift register unit provided by the embodiments of the present disclosure, the pull-up node is charged according to the input signal, the output signal is output to the output terminal under control of the voltage of the pull-up node, the reset control signal is output according to the output signal and the reset signal provided by the first reset terminal, and the voltage of the pull-up node and the output signal are reset according to the reset control signal. Therefore, the reset of the current stage shift register unit can be achieved according to the output signal of the current stage shift register unit without cascade output signals, the mutual influence among a plurality of shift register units is weakened, in a case where a single shift register unit is abnormal, the abnormality of a plurality of shift register units cannot be caused, and an abnormal position can be quickly positioned.

Figure 6:
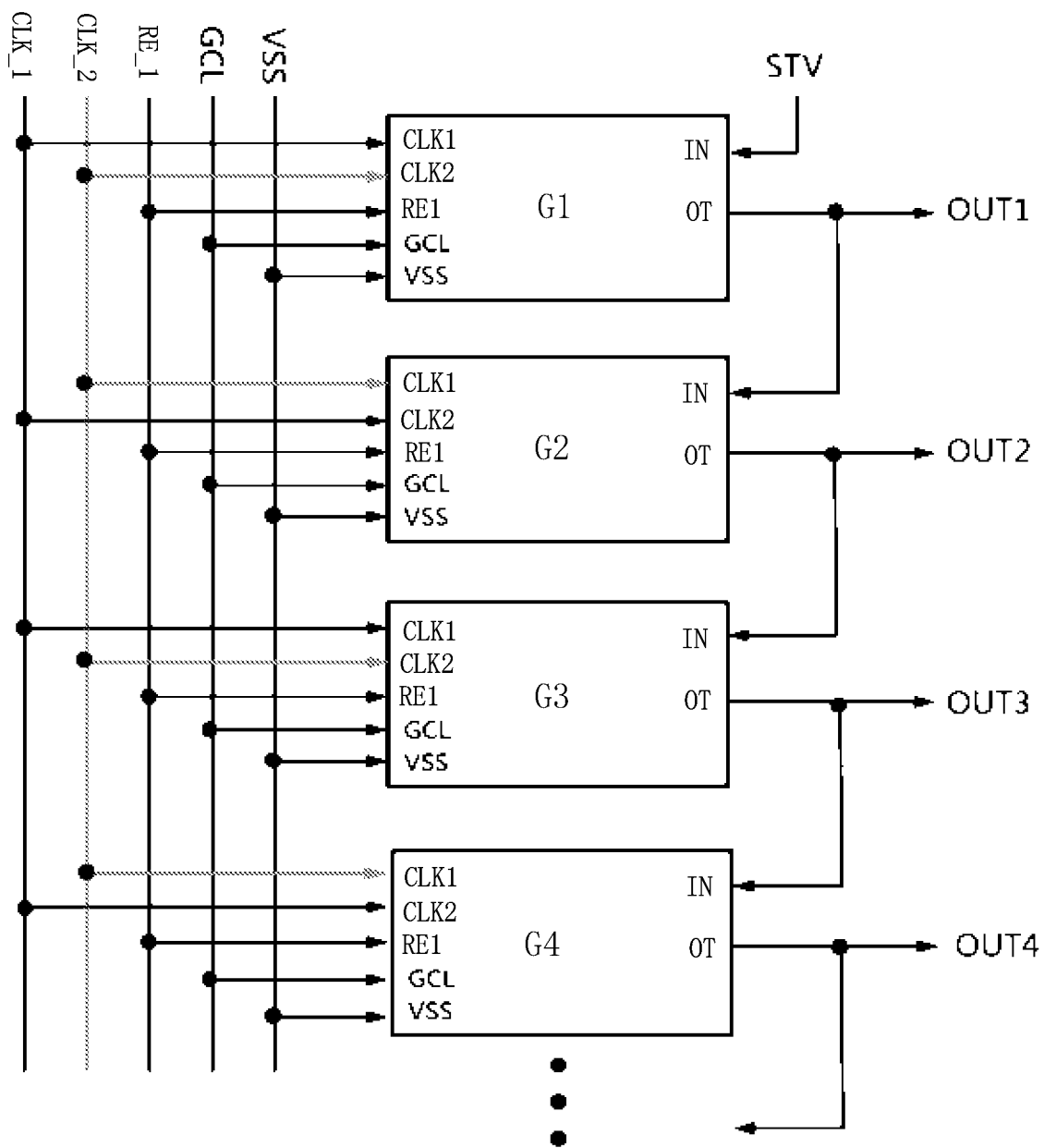
FIG. 6 is a structural schematic diagram of a gate drive circuit provided by some embodiments of the present disclosure.

FIG. 6 is a schematic structural diagram of a gate drive circuit provided by some embodiments of the present disclosure. The gate drive circuit includes the shift register unit provided by any one of embodiments of the present disclosure.

As shown in FIG. 6, the gate drive circuit may include a plurality of shift register units (e.g., a first shift register unit G1, a second shift register unit G2, a third shift register unit G3, a fourth shift register unit G4, etc.). The plurality of shift register units are connected in cascade.

For example, the gate drive circuit further includes a first clock signal line CLK_1 and a second clock signal line CLK_2, and a phase of a clock signal provided by the second clock signal line CLK_2 is one half cycle later than a phase of a clock signal provided by the first clock signal line CLK_1. It should be noted that a phase relationship among a plurality of clock signals provided by the timing controller T-CON may be determined according to actual requirements, and the present disclosure is not limited to this case.

For example, the gate drive circuit further includes a reset signal line RE_1. A first reset terminal of each of the plurality of shift register units is connected to the reset signal line RE_1.

Figure 9:
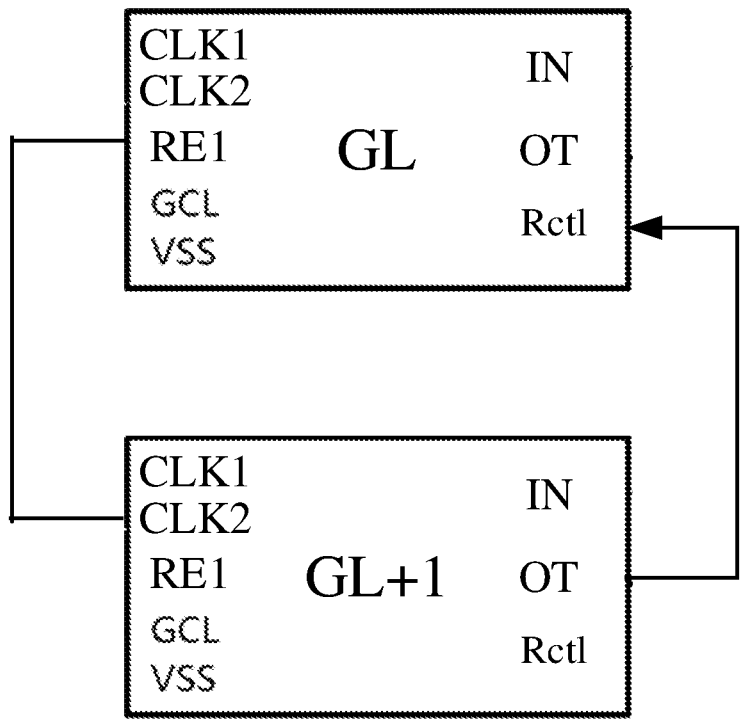
FIG. 9 is a schematic structural diagram of a gate drive circuit provided by an embodiment of the present disclosure.

FIG. 9 is a schematic structural diagram of a gate drive circuit provided by an embodiment of the present disclosure. The gate drive circuit includes the shift register unit provided by any one of embodiments of the present disclosure.

As shown in FIG. 9, the gate drive circuit may include a plurality of shift register units (e.g., a L-th shift register unit GL, a (L+1)-th shift register unit GL+1, etc.). The plurality of shift register units are connected in cascade.

For example, in some embodiments, in a case where a reset signal control circuit of each shift register unit is connected to the reset control input terminal, that is, the gate drive circuit includes a plurality of shift register units as shown in FIG. 1A, except for a last shift register unit in the plurality of shift register units, as shown in FIG. 9, a reset control input terminal of a L-th shift register unit GL is connected to an output terminal of a (L+1)-th shift register unit GL+1, i.e., an output signal of a cascade shift register unit in a next stage is output to the reset control input terminal of the current stage shift register unit as the reset control input signal. In this example, a first reset terminal RE1 of the L-th shift register unit GL is connected to a second clock signal terminal CLK2 of the (L+1)-th shift register unit GL+1, and L is an integer greater than 0.

For example, in some examples, a first clock signal terminal of the L-th shift register unit is connected to the first clock signal line CLK_1, and a second clock signal terminal of the L-th shift register unit is connected to the second clock signal line CLK_2; and a first clock signal terminal of the (L+1)-th shift register unit is connected to the second clock signal line CLK_2, and a second clock signal terminal of the (L+1)-th shift register unit is connected to the first clock signal line CLK_1. At this time, the first reset terminal of the L-th shift register unit is connected to the first clock signal line CLK_1.

For example, in other embodiments, the gate drive circuit includes a plurality of shift register units as shown in FIG. 1D. As shown in FIG. 6, a reset signal control circuit of the current stage shift register unit is connected to an output terminal of the current stage shift register unit to receive an output signal output by the current stage shift register unit as a reset control input signal to implement a self-reset function. In this example, for each shift register unit, a first reset terminal RE1 may be connected to the second clock signal terminal CLK2, so that the first reset terminal RE1 and the second clock signal terminal CLK2 may share one signal line, that is, the gate drive circuit may not include the reset signal line RE_1.

Figure 10:
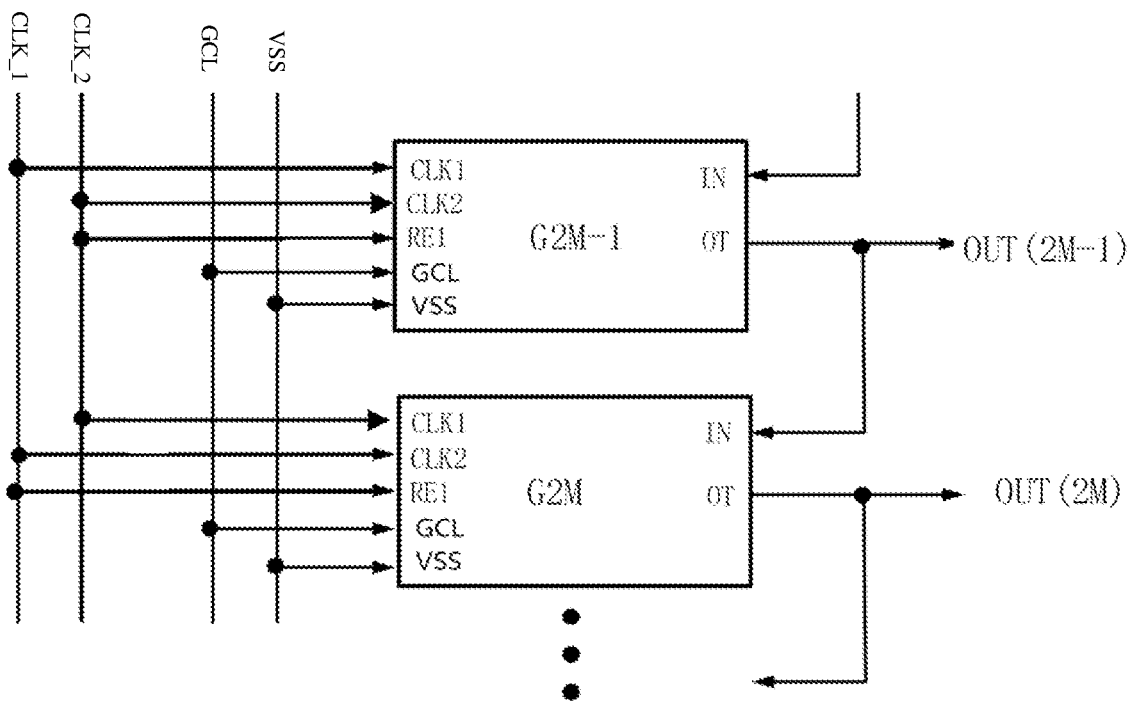
FIG. 10 is a structural schematic diagram of a gate drive circuit provided by an embodiment of the present disclosure.

FIG. 10 is a schematic structural diagram of a gate drive circuit provided by an embodiment of the present disclosure. The gate drive circuit includes the shift register unit provided by any one of embodiments of the present disclosure.

As shown in FIG. 10, the gate drive circuit may include a plurality of shift register units (e.g., a (2M−1)-th shift register unit G2M−1, a (2M)-th shift register unit G2M, etc.). The plurality of shift register units are connected in cascade.

For example, in the plurality of shift register units, as shown in FIG. 6, an input terminal of the first shift register unit G1 is connected to a start signal line STV, and except for the first shift register unit G1, an input terminal of an N-th shift register unit is connected to an output terminal of a (N−1)-th shift register unit; as shown in FIG. 10, a first clock signal terminal CLK1 of a (2M−1)-th (i.e., odd number) shift register unit G2M−1 is connected to the first clock signal line CLK_1, a second clock signal terminal CLK_2 of the (2M−1)-th shift register unit G2M−1 is connected to the second clock signal line CLK_2, the first reset terminal RE1 and the second clock signal terminal CLK_2 may share one signal line, and at this time, a first reset terminal of the (2M−1)-th shift register unit G2M−1 is connected to the second clock signal line CLK_2; and a first clock signal terminal CLK1 of a (2M)-th (i.e., even number) shift register unit G2M is connected to the second clock signal line CLK_2, a second clock signal terminal CLK_2 of the (2M)-th shift register unit G2M is connected to the first clock signal line CLK_1, the first reset terminal RE1 and the second clock signal terminal CLK_2 may share one signal line, and a first reset terminal of the (2M)-th shift register unit G2M is connected to the first clock signal line CLK_1 at this time.

For example, both N and M are positive integers, and N is greater than or equal to 2.

That is, the input terminal IT of the first shift register unit G1 of the plurality of shift register units receives an input signal provided by the start signal line STV, and an output signal OUT1 of the first shift register unit G1 is used as an input signal of the second shift register unit G2, and so on. In addition, a clock signal provided by the first clock signal line CLK_1 serves as a first clock signal of the (2M−1)-th shift register unit G2M−1, a clock signal provided by the second clock signal line CLK_2 serves as a second clock signal of the (2M−1)-th shift register unit G2M−1, and the clock signal provided by the second clock signal line CLK_2 also serves as a reset signal of the (2M−1)-th shift register unit G2M−1. The clock signal provided by the second clock signal line CLK_2 serves as a first clock signal of the (2M)-th shift register unit G2M, the clock signal provided by the first clock signal line CLK_1 serves as a second clock signal of the (2M)-th shift register unit G2M, and the clock signal provided by the first clock signal line CLK_1 also serves as a reset signal of the (2M)-th shift register unit G2M.

For example, as shown in FIG. 6, the input signal provided by the start signal line STV serves as the input signal of the first shift register unit G1, and the output signal of each shift register unit serves as the input signal of the next shift register unit starting from the second shift register unit G2. The total reset terminal GCL provides the total reset signal after the end of each frame, and the total reset signal is effective when the total reset signal is at a high level. At this time, pull-down circuits in all shift register units reset corresponding output terminals OT, and at the same time, first nodes of reset signal control circuits of all shift register units is discharged to stop resetting pull-up nodes. The reset signal directly adopts a clock signal, and when the clock signal is at a high level, the pull-up node is reset, and because the total reset terminal GCL discharges the first node of the reset signal control circuit only after each frame is ended, the pull-up node can be repeatedly discharged for several times by the clock signal within one frame time, i.e., the pull-up node is reset for several times. First clock signals of odd row shift register units such as a first row, a third row, a fifth row, etc. are respectively identical to reset signals of even row shift register units such as a second row, a fourth row, a sixth row, etc., reset signals of odd row shift register units such as the first row, the third row, the fifth row, etc. are respectively the same as first clock signals of even row shift register units such as the second row, the fourth row, the sixth row, etc., and the first clock signals of odd row shift register units such as the first row, the third row, the fifth row, etc. are opposite in phase to the first clock signals of even row shift register units such as the second row, the fourth row, the sixth row, etc.

Figure 7:
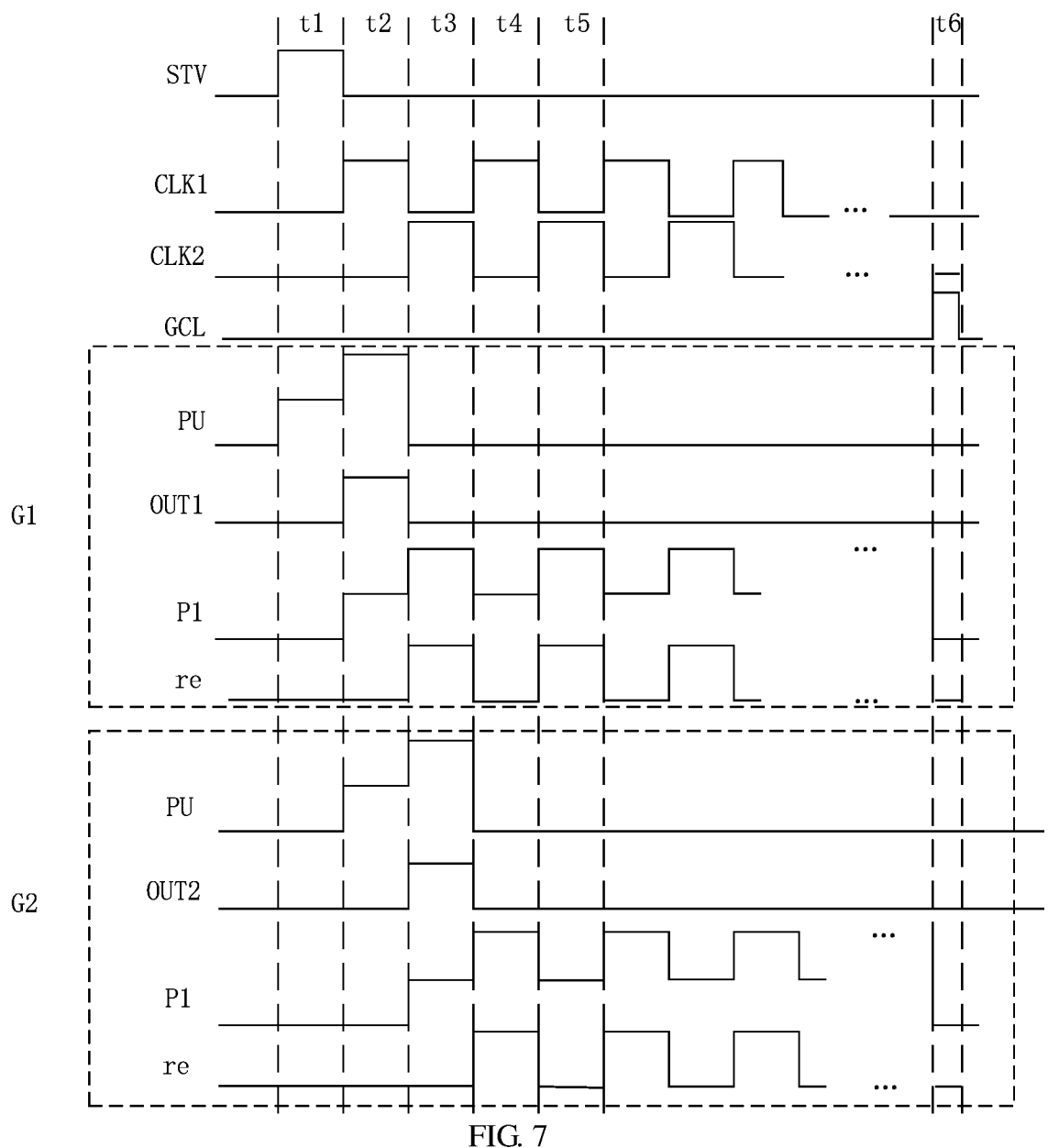
FIG. 7 is a timing chart of the gate drive circuit as shown in FIG. 6 in operation.

FIG. 7 is a timing chart of the gate drive circuit as shown in FIG. 6 in operation.

As shown in FIGS. 6 and 7, during a time t1, the input signal provided by the start signal line STV is at a high level. At this time, the first transistor M1 in the first shift register unit G1 is turned on to charge the pull-up node PU of the first shift register unit G1, the voltage of the pull-up node PU of the first shift register unit G1 becomes at a high level, and the second transistor M2 of the first shift register unit G1 is turned on.

Then, when the clock signal provided by the first clock signal line CLK_1 is at a high level, the output terminal OT of the first shift register unit G1 outputs the high level portion of the clock signal provided by the first clock signal line CLK_1, that is, the output signal OUT1 of the first shift register unit G1 is at a high level during a time t2. Under the bootstrap effect of the first capacitor C1 of the first shift register unit G1, the voltage of the pull-up node PU of the first shift register unit G1 continues to rise, so that the second transistor M2 of the first shift register unit G1 is more fully turned on. Meanwhile, under the action of the output signal OUT1 of the first shift register unit G1, the third transistor M3 of the first shift register unit G1 is turned on, the voltage output by the first preset power supply VGH is transmitted to the first node P1 of the first shift register unit G1 to charge the first node P1 of the first shift register unit G1, the voltage of the first node P1 of the first shift register unit G1 becomes at a high level, the fourth transistor M4 of the first shift register unit G1 is turned on. Because the clock signal provided by the second clock signal line CLK_2 is at a low level at this time, the seventh transistor M7 of the first shift register unit G1 cannot be turned on, and the voltage of the pull-up node PU of the first shift register unit G1 is continued to be at a high level.

Meanwhile, during the time t2, under control of the output signal OUT1 of the first shift register unit G1, the first transistor M1 of the second shift register unit G2 is turned on to charge the pull-up node PU of the second shift register unit G2, the voltage of the pull-up node PU of the second shift register unit G2 becomes at a high level, and the second transistor M2 of the second shift register unit G2 is turned on.

During a time t3, the clock signal provided by the first clock signal line CLK_1 becomes at a low level, and the output terminal OT of the first shift register unit G1 becomes at a low level, and at this time, the first shift register unit G1 completes the output. At this time, the clock signal provided by the second clock signal line CLK_2 becomes at a high level, due to a bootstrap effect of the second capacitor C2 in the first shift register unit G1, the voltage of the first node P1 continues to rise, and the fourth transistor M4 continues to be in a turn-on state and is more fully turned on. At this time, the reset signal control circuit 40 of the first shift register unit G1 outputs the reset control signal re, and the reset control signal re is a high level signal. The seventh transistor M7 of the first shift register unit G1 is turned on, the pull-up node PU of the first shift register unit G1 starts being discharged and returns to be at a low level, the second transistor M2 of the first shift register unit G1 is turned off, and the first shift register unit G1 stops outputting.

During a time t3, when the clock signal provided by the second clock signal line CLK_2 becomes at a high level, the output terminal OT of the second shift register unit G2 outputs the high level portion of the clock signal provided by the second clock signal line CLK_2, that is, during the time t3, the output signal OUT2 of the second shift register unit G2 is at a high level. At the same time, under the bootstrap effect of the first capacitor C1 of the second shift register unit G2, the voltage of the pull-up node PU of the second shift register unit G2 continues to rise, so that the second transistor M2 of the second shift register unit G2 is more fully turned on. Meanwhile, under the action of the output signal OUT2 of the second shift register unit G2, the third transistor M3 of the second shift register unit G2 is turned on, the voltage output by the first preset power supply VGH is transmitted to the first node P1 of the second shift register unit G2 to charge the first node P1 of the second shift register unit G2, and the voltage of the first node P1 of the second shift register unit G2 becomes at a high level, the fourth transistor M4 in the second shift register unit G2 is turned on. Because the clock signal provided by the first clock signal line CLK_1 is at a low level at this time, the seventh transistor M7 of the second shift register unit G2 cannot be turned on, and the voltage of the pull-up node PU of the second shift register unit G2 is continued to be at a high level.

During a time t4, the clock signal provided by the second clock signal line CLK_2 becomes at a low level, the output terminal of the second shift register unit G2 becomes at a low level, and at this time, the second shift register unit G2 completes the output. At this time, the clock signal provided by the first clock signal line CLK_1 becomes at a high level, due to the bootstrap effect of the second capacitor C2 of the second shift register unit G2, the voltage of the first node P1 of the second shift register unit G2 continues to rise, and the fourth transistor M4 of the second shift register unit G2 continues to be in a turn-on state and is more fully turned on. At this time, the reset signal control circuit 40 of the second shift register unit G2 outputs the reset control signal re, and the reset control signal re is at a high level. The seventh transistor M7 of the second shift register unit G2 is turned on, the pull-up node PU of the second shift register unit G2 starts being discharged and returns to be at a low level, the second transistor M2 of the second shift register unit G2 is turned off, and the second shift register unit G2 stops outputting.

During the time t4, the clock signal provided by the second clock signal line CLK_2 becomes at a low level, that is, the reset signal provided by the first reset terminal RE1 of the first shift register unit G1 becomes at a low level, and the reset signal is output to the second node P2 of the first shift register unit G1, that is, the second node P2 of the first shift register unit G1 changes from a high level to a low level. At this time, due to the bootstrap effect of the second capacitor C2 of the first shift register unit G1, the voltage of the first node P1 of the first shift register unit G1 drops and returns to be the voltage value during the time t2. Although the fourth transistor M4 of the first shift register unit G1 is still in the turn-on state, the reset signal control circuit 40 of the first shift register unit G1 stops outputting the reset control signal re. At this time, the reset signal control circuit 40 of the first shift register unit G1 outputs a low level signal, and the seventh transistor M7 of the first shift register unit G1 is turned off to stop discharging the pull-up node PU of the first shift register unit G1.

Meanwhile, after the time t4, because the total reset signal is only provided by the total reset terminal GCL at the end of the frame, and the first node P1 of the first shift register unit G1 is discharged under control of the total reset signal, the voltage of the first node P1 of the first shift register unit G1 is always at a high level during one frame time. The reset control signal re of the first shift register unit G1 is synchronized with the clock signal provided by the second clock signal line CLK_2. When the clock signal provided by the second clock signal line CLK_2 is at a high level, the seventh transistor M7 of the first shift register unit G1 is turned on to discharge the pull-up node PU of the first shift register unit G1 for several times.

For example, during a time t5, the clock signal provided by the second clock signal line CLK_2 becomes at a high level, that is, the reset signal provided by the first reset terminal RE1 of the first shift register unit G1 becomes at a high level again, the reset signal control circuit 40 of the first shift register unit G1 outputs the reset control signal re again, and the reset control signal re becomes a high level signal, the seventh transistor M7 of the first shift register unit G1 is turned on, and the pull-up node PU of the first shift register unit G1 is discharged again, so that the pull-up node PU of the first shift register unit G1 can be repeatedly discharged during one frame time. For example, the pull-up node PU of the first shift register unit G1 is discharged for the first time during the time t3, and the pull-up node PU of the first shift register unit G1 is discharged for the second time during the time t5.

During the time t5, the clock signal provided by the first clock signal line CLK_1 becomes at a low level, and the discharge of the pull-up node PU of the second shift register unit G2 is completed.

After the time t5, because the total reset terminal GCL provides a high level total reset signal only at the end of the frame, and the first node P1 of the second shift register unit G2 is discharged under control of the total reset signal, and therefore, the voltage of the first node P1 of the second shift register unit G2 is always at a high level during one frame time. The reset control signal re of the second shift register unit G2 is synchronized with the clock signal provided by the first clock signal line CLK_1. When the clock signal provided by the first clock signal line CLK_1 is at a high level, the seventh transistor M7 of the second shift register unit G2 is turned on to discharge the pull-up node PU of the second shift register unit G2 for several times.

During a time t6, i.e., at the end of a frame time, i.e., at the end of the frame, when the total reset signal provided by the total reset terminal GCL becomes at a high level, the ninth transistor M9 of each shift register unit (e.g., the first shift register unit G1 and the second shift register unit G2) is turned on to reset output terminals OT of all shift register units. Meanwhile, the sixth transistor M6 of each shift register unit is turned on to discharge first nodes P1 of all shift register units, so that the first nodes P1 of all shift register units becomes at a low level, fourth transistors M4 of all shift register units are turned off, while fifth transistors M5 of all shift register units are turned on, and the reset signal control circuits of all shift register units output low level signals (i.e., the voltage output by the second preset power supply VSS2), thereby stopping to reset the pull-up nodes PU. At the beginning of a next frame time, the pull-up nodes PU of the respective shift register units are sequentially charged again.

Therefore, according to the gate drive circuit of the embodiments of the present disclosure, through the plurality of shift register units, the reset of each shift register unit can be achieved without cascaded output signals, mutual influence among the shift register units is weakened, in a case where a single shift register unit is abnormal, the abnormality of a plurality of shift register units cannot be caused, and an abnormal position can be quickly positioned.

Figure 8:
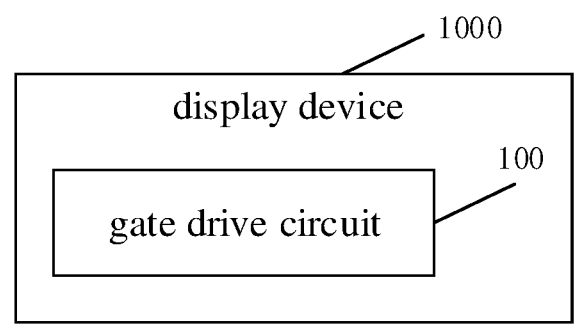
FIG. 8 is a block schematic diagram of a display device provided by some embodiments of the present disclosure.

FIG. 8 is a block schematic diagram of a display device provided by some embodiments of the present disclosure. As shown in FIG. 8, the display device 1000 of the embodiment of the present disclosure may include the gate drive circuit 100 described above.

For example, the display device 1000 may be an OLED display panel, an OLED television, an OLED display, or the like, or other suitable products or components having a display function, and the embodiments of the present disclosure are not limited thereto. The technical effects of the display device 1000 can refer to the corresponding descriptions of the shift register unit and the gate drive circuit in the above-mentioned embodiments, and are not repeated herein again.

For example, in some examples, the display device 1000 further includes a display panel. The display panel includes a plurality of pixel units and is used for displaying images, and the gate drive circuit 100 is integrated on the display panel.

The display device 1000 may also include other components, such as a timing controller, a data driver, a signal decoding circuit, a voltage conversion circuit, etc. The components may, for example, adopt conventional components, which will not be described in detail herein.

It should be understood that the terms "first" and "second" are used for descriptive purposes only and cannot be understood as indicating or implying relative importance or implicitly indicating the number of technical features indicated. Thus, features defining "first" and "second" may explicitly or implicitly include at least one of the features. In the description of the present disclosure, the meaning of "a plurality of" is at least two, such as two, three, etc., unless otherwise specifically defined.

In the present disclosure, unless otherwise explicitly specified and defined, the terms "mounted", "connected", "fixed", and the like shall be broadly understood, for example, it may be a fixed connection, a detachable connection or integrated, can be also mechanical connection or electrical connection, can be directly connected or indirectly connected through an intermediate medium, and can be the internal communication between two elements or the interaction between two elements, unless otherwise explicitly defined. For those of ordinary skill in the art, the specific meanings of the above terms of the present disclosure can be understood according to specific situations.

In the description of this specification, the description of the reference terms "an embodiment," "some embodiments," "examples," "specific examples," or "some examples" and the like means that a specific feature, structure, material, or characteristic described in connection with the embodiment or example is included in at least one embodiment or example of the present disclosure. In the specification, the schematic representation of the above-mentioned terms does not necessarily refer to the same embodiment or example. Moreover, the specific features, structures, materials, or characteristics described may be combined in any one or more embodiments or examples in a suitable manner. In addition, in a case of no contradictions, those skilled in the art can unite and combine different embodiments or examples described in this specification and features of different embodiments or examples.

Although the embodiments of the present disclosure have been shown and described above, it should be understood that the above-mentioned embodiments are exemplary and not be construed as limiting the present disclosure, and those of ordinary skill in the art may make changes, modifications, substitutions and variations to the above-mentioned embodiments within the scope of the present disclosure.

What is claimed is:

1. A shift register unit, comprising:
an input circuit, connected to a pull-up node, and configured to charge the pull-up node according to an input signal;
an output circuit, connected to the pull-up node and an output terminal respectively, and configured to output an output signal to the output terminal under control of a voltage of the pull-up node;
a reset circuit, connected to the pull-up node, and configured to reset the pull-up node; and
a reset signal control circuit, connected to a first reset terminal and the reset circuit respectively, and configured to generate and output a reset control signal according to a reset control input signal and a reset signal provided by the first reset terminal,
wherein the reset control signal is configured to control the reset circuit to perform a reset operation the reset signal control circuit is further connected to the output terminal to receive the output signal as the reset control input signal;
the reset signal control circuit is further connected to a total reset terminal, and is further configured to stop outputting the reset control signal according to a total reset signal provided by the total reset terminal;
the reset signal control circuit comprises a reset control input sub-circuit, a reset control output sub-circuit, and reset control reset sub-circuit, the reset control input sub-circuit is connected to a first node, and is configured to charge the first node according to the reset control input signal;
the reset control output sub-circuit is respectively connected to the first reset terminal, the first node and a second node, and is configured to generate and output the reset control signal to the second node according to the reset signal under control of a voltage of the first node;
the reset control reset sub-circuit is connected to the first node and the total reset terminal and is configured to reset the first node under control of the total reset signal provided by the total reset terminal;
the reset signal control circuit further comprises a reset control noise reduction sub-circuit, the reset control noise reduction sub-circuit is connected to the second node and the total reset terminal, and is configured to perform denoising on the second node under control of the total reset signal provided by the total reset terminal;
the reset control input sub-circuit comprises a third transistor, a first terminal of the third transistor is connected to a first preset power supply, a second terminal of the third transistor is connected to the first node, and a control terminal of the third transistor is configured to receive the reset control input signal;
the reset control output sub-circuit comprises a fourth transistor and a second capacitor, a first terminal of the fourth transistor is connected to the first reset terminal, a second terminal of the fourth transistor is connected to the second node, a control terminal of the fourth transistor is connected to the first node, a first terminal of the second capacitor is connected to the first node, and a second terminal of the second capacitor is connected to the second node;

the reset control noise reduction sub-circuit comprises a fifth transistor, a first terminal of the fifth transistor is connected to the second node, a second terminal of the fifth transistor is connected to a second preset power supply, and a control terminal of the fifth transistor is connected to the total reset terminal; and the reset control reset sub-circuit comprises a sixth transistor, a control terminal of the sixth transistor is connected to the total reset terminal, a first terminal of the sixth transistor is connected to the first node, and a second terminal of the sixth transistor is connected to the second preset power supply.

2. The shift register unit according to claim 1, wherein the reset circuit is further connected to the output terminal, and is configured to reset the output terminal under control of the reset control signal.

3. The shift register unit according to claim 2, wherein the reset circuit further comprises an eighth transistor,
a first terminal of the eighth transistor is connected to the output terminal, a control terminal of the eighth transistor is connected to the reset signal control circuit to receive the reset control signal, and a second terminal of the eighth transistor is connected to a third preset power supply.

4. The shift register unit according to claim 1, further comprising:
a pull-down circuit, connected to the output terminal and the total reset terminal respectively, and configured to reset the output terminal according to the total reset signal provided by the total reset terminal;
a noise control circuit, connected to a second clock signal terminal and a pull-down node respectively, and configured to pull up a voltage of the pull-down node according to a second Clock signal provided by the second clock signal terminal;
a first denoising circuit, connected to the pull-down node and the pull-up node respectively; and configured to perform denoising on the voltage of the pull-up node under control of the voltage of the pull-down node; and
a second denoising circuit, connected to the pull-down node and the output terminal respectively, and configured to perform denoising on the output terminal under control of the voltage of the pull-down node.

5. The shift register unit according to claim 4, wherein the reset signal is the second clock signal.

6. The shift register unit according to claim 4, wherein the pull-down circuit comprises a ninth transistor,
a first terminal of the ninth transistor is connected to the output terminal, a control terminal of the ninth transistor is connected to the total reset terminal, and a second terminal of the ninth transistor is connected to a third preset power supply;
the noise control circuit comprises:
a tenth transistor, wherein a first terminal of the tenth transistor is connected to a control terminal of the tenth transistor and then connected to the second clock signal terminal, and a second terminal of the tenth transistor is connected to a third node;
an eleventh transistor, wherein a first terminal of the eleventh transistor is connected to the second clock signal terminal, a control terminal of the eleventh transistor is connected to the third node, and a second terminal of the eleventh transistor is connected to the pull-down node;
a twelfth transistor, wherein a first terminal of the twelfth transistor is connected to the third node, a control terminal of the twelfth transistor is connected to the pull-up node, and a second terminal of the twelfth transistor is connected to a third preset power supply; and
a thirteenth transistor, wherein a first terminal of the thirteenth transistor is connected to the pull-down node, a control terminal of the thirteenth transistor is connected to the pull-up node, and a second terminal of the thirteenth transistor is connected to the third preset power supply.

7. The shift register unit according to claim 4, wherein the first denoising circuit comprises a fourteenth transistor, the second denoising circuit comprises a fifteenth transistor,
a first terminal of the fourteenth transistor is connected to the pull-up node, a control terminal of the fourteenth transistor is connected to the pull-down node, and a second terminal of the fourteenth transistor is connected to a third preset power supply; and
a first terminal of the fifteenth transistor is connected to the output terminal, a control terminal of the fifteenth transistor is connected to the pull-down node, and a second terminal of the fifteenth transistor is connected to the third preset power supply.

8. The shift register unit according to claim 1, wherein the input circuit comprises a first transistor, a first terminal of the first transistor is connected to a control terminal of the first transistor and then connected to an input terminal, a second terminal of the first transistor is connected to the pull-up node, and the input terminal is configured to provide the input signal;
the output circuit is further connected to a first clock signal terminal, and configured to generate the output signal according to a first clock signal provided by the first clock signal terminal under control of the voltage of the pull-up node;
the output circuit comprises:
a second transistor, wherein a first terminal of the second transistor is connected to the first clock signal terminal, a control terminal of the second transistor is connected to the pull-up node, and a second terminal of the second transistor is connected to the output terminal; and
a first capacitor, wherein a first terminal of the first capacitor is connected to the control terminal of the second transistor, and a second terminal of the first capacitor is connected to the second terminal of the second transistor.

9. The shift register unit according to claim 1, wherein the reset circuit comprises a seventh transistor,
a control terminal of the seventh transistor is connected to the reset signal control circuit to receive the reset control signal, a first terminal of the seventh transistor is connected to the pull-up node, and a second terminal of the seventh transistor is connected to a third preset power supply.

10. The shift register unit according to claim 1, further comprising: a pull-down circuit, a noise control circuit, a first denoising circuit, and a second denoising circuit,
wherein the input circuit comprises a first transistor, a first terminal of the first transistor is connected to a control terminal of the first transistor and then connected to an input terminal, a second terminal of the first transistor is connected to the pull-up node;
the output circuit comprises: a second transistor and a first capacitor, wherein a first terminal of the second transistor is connected to a first clock signal terminal, a control terminal of the second transistor is connected to the pull-up node, and a second terminal of the second transistor is connected to the output terminal; and a first terminal of the first capacitor is connected to the control terminal of the second transistor, and a second terminal of the first capacitor is connected to the second terminal of the second transistor;

the reset control input sub-circuit comprises a third transistor, a control terminal of the third transistor is connected to the output terminal;

the reset circuit comprises a seventh transistor and an eighth transistor, a control terminal of the seventh transistor is connected to the second node to receive the reset control signal, a first terminal of the seventh transistor is connected to the pull-up node, and a second terminal of the seventh transistor is connected to a third preset power supply; and a first terminal of the eighth transistor is connected to the output terminal, a control terminal of the eighth transistor is connected to the second node to receive the reset control signal, and a second terminal of the eighth transistor is connected to the third preset power supply;

the pull-down circuit comprises a ninth transistor, a first terminal of the ninth transistor is connected to the output terminal, a control terminal of the ninth transistor is connected to the total reset terminal, and a second terminal of the ninth transistor is connected to the third preset power supply;

the noise control circuit comprises: a tenth transistor, an eleventh transistor, a twelfth transistor, and a thirteenth transistor, wherein a first terminal of the tenth transistor is connected to a control terminal of the tenth transistor and then connected to a second clock signal terminal, and a second terminal of the tenth transistor is connected to a third node; a first terminal of the eleventh transistor is connected to the second clock signal terminal, a control terminal of the eleventh transistor is connected to the third node, and a second terminal of the eleventh transistor is connected to a pull-down node; a first terminal of the twelfth transistor is connected to the third node, a control terminal of the twelfth transistor is connected to the pull-up node, and a second terminal of the twelfth transistor is connected to the third preset power supply; and a first terminal of the thirteenth transistor is connected to the pull-down node, a control terminal of the thirteenth transistor is connected to the pull-up node, and a second terminal of the thirteenth transistor is connected to the third preset power supply;

the first denoising circuit comprises a fourteenth transistor, a first terminal of the fourteenth transistor is connected to the pull-up node, a control terminal of the fourteenth transistor is connected to the pull-down node, and a second terminal of the fourteenth transistor is connected to the third preset power supply;

the second demising circuit comprises a fifteenth transistor, a first terminal of the fifteenth transistor is connected to the output terminal, a control terminal of the fifteenth transistor is connected to the pull-down node, and a second terminal of the fifteenth transistor is connected to the third preset power supply.

11. A driving method for driving a shift register unit, wherein the shift register unit comprises: an input circuit, connected to a pull-up node, and configured to charge the pull-up node according to an input signal; an output circuit, connected to the pull-up node and an output terminal respectively, and configured to output an output signal to the output terminal under control of a voltage of the pull-up node; a reset circuit, connected to the pull-up node, and configured to reset the pull-up node; and a reset signal control circuit, connected to a first reset terminal and the reset circuit respectively, and configured to generate and output a reset control signal according to a reset control input signal and a reset signal provided by the first reset terminal, the reset control signal is configured to control the reset circuit to perform a reset operation, the reset signal control circuit is further connected to the output terminal to receive the output signal as the reset control input signal;

the reset signal control circuit is further connected to a total reset terminal, and is further configured to stop outputting the reset control signal according to a total reset signal provided by the total reset terminal;

the reset signal control circuit comprises a reset control input sub-circuit, a reset control output sub-circuit, and a reset control reset sub-circuit, the reset control input sub-circuit is connected to a first node, and is configured to charge the first node according to the reset control input signal;

the reset control output sub-circuit is respectively connected to the first reset terminal, the first node and a second node, and is configured to generate and output the reset control signal to the second node according to the reset signal under control of a voltage of the first node;

the reset control reset sub-circuit is connected to the first node and the total reset terminal, and is configured to reset the first node under control of the total reset signal provided by the total reset terminal;

the reset signal control circuit further comprises a reset control noise reduction sub-circuit, the reset control noise reduction sub-circuit is connected to the second node and the total reset terminal and is configured to perform denoising on the second node under control of the total reset signal provided by the total reset terminal;

the reset control input sub-circuit comprises a third transistor, a first terminal of the third transistor is connected to a first preset power supply, a second terminal of the third transistor is connected to the first node, and a control terminal of the third transistor is configured to receive the reset control input signal;

the reset control output sub-circuit comprises a fourth transistor and a second capacitor, a first terminal of the fourth transistor is connected to the first reset terminal, a second terminal of the fourth transistor is connected to the second node, a control terminal of the fourth transistor is connected to the first node, a first terminal of the second capacitor is connected to the first node, and a second terminal of the second capacitor is connected to the second node;

the reset control noise reduction sub-circuit comprises a fifth transistor, a first terminal of the fifth transistor is connected to the second node, a second terminal of the fifth transistor is connected to a second preset power supply, and a control terminal of the fifth transistor is connected to the total reset terminal; and the reset control reset sub-circuit comprises a sixth transistor, a control terminal of the sixth transistor is connected to the total reset terminal, a first terminal of the sixth transistor is connected to the first node, and a second terminal of the sixth transistor is connected to the second preset power supply;

the driving method comprises:
charging the pull-up node according to the input signal;
outputting the output signal to the output terminal under control of the voltage of the pull-up node;
generating and outputting the reset control signal according to the reset control input signal and the reset signal; and
resetting the pull-up node according to the reset control signal.

12. The driving method of the shift register unit according to claim 11, further comprising:
stopping outputting the reset control signal according to a total reset signal provided by a total reset terminal.

13. A gate drive circuit comprising a plurality of shift register units,
wherein each of the plurality of shift register units comprises: an input circuit, connected to a pull-up node, and configured to charge the pull-up node according to an input signal; an output circuit, connected to the pull-up node and an output terminal respectively, and configured to output an output signal to the output terminal under control of a voltage of the pull-up node; a reset circuit, connected to the pull-up node, and configured to reset the pull-up node; and a reset signal control circuit, connected to a first reset terminal and the reset circuit respectively; and configured to generate and output a reset control signal according to a reset control input signal and a reset signal provided by the first reset terminal,
the reset control signal is configured to control the reset circuit to perform a reset operation, the reset signal control circuit is connected to the output terminal to receive the output signal as the reset control input signal;
the reset signal control circuit is further connected to a total reset terminal, and is further configured to stop outputting the reset control signal according to a total reset signal provided by the total reset terminal;
the reset signal control circuit comprises a reset control input sub-circuit, a reset control output sub-circuit, and a reset control reset sub-circuit, the reset control input sub-circuit is connected to a first node, and is configured to charge the first node according to the reset control input signal;
the reset control output sub-circuit is respectively connected to the first reset terminal, the first node and a second node, and is configured to generate an output the reset control signal to the second node according to the reset signal under control of a voltage of the first node;
the reset control reset sub-circuit is connected to the first node and the total reset terminal, and is configured to reset the first node under control of the total reset signal provided by the total reset terminal;
the reset signal control circuit further comprises a reset control noise reduction sub-circuit, the reset control noise reduction sub-circuit is connected to the second node and the total reset terminal, and is configured to perform denoising on the second node under control of the total reset signal provided by the total reset terminal;
the reset control input sub-circuit comprises a third transistor, a first terminal of the third transistor is connected to a first preset power supply, a second terminal of the third transistor is connected to the first node, and a control terminal of the third transistor is configured to receive the reset control input signal;
the reset control output sub-circuit comprises a fourth transistor and a second capacitor, a first terminal of the fourth transistor is connected to the first reset terminal, a second terminal of the fourth transistor is connected to the second node, a control terminal of the fourth transistor is connected to the first node, a first terminal of the second capacitor is connected to the first node, and a second terminal of the second capacitor is connected to the second node;
the reset control noise reduction sub-circuit comprises a fifth transistor, a first terminal of the fifth transistor is connected to the second node, a second terminal of the fifth transistor is connected to a second preset power supply, and a control terminal of the fifth transistor is connected to the total reset terminal; and
the reset control reset sub-circuit comprises a sixth transistor, a control terminal of the sixth transistor is connected to the total reset terminal, a first terminal of the sixth transistor is connected to the first node, and a second terminal of the sixth transistor is connected to the second preset power supply.

14. The gate drive circuit according to claim 13,
wherein in the plurality of the shift register units, an input terminal of a first shift register unit of the plurality of shift register units is connected to a start signal line, and except for the first shift register unit, an input terminal of an N-th shift register unit of the plurality of shift register units is connected to an output terminal of an (N−1)-th shift register unit of the plurality of shift register units;
a first clock signal terminal of a (2M−1)-th shift register unit of the plurality of shift register units is connected to a first clock signal line, a second clock signal terminal of the (2M−1)-th shift register unit is connected to a second clock signal line, and a first reset terminal of the (2M−1)-th shift register unit is connected to the second clock signal line; and
a first clock signal terminal of a (2M)-th shift register unit of the plurality of shift register units is connected to the second clock signal line, a second clock signal terminal of the (2M)-th shift register unit is connected to the first clock signal line, a first reset terminal of the (2M)-th shift register unit is connected to the first clock signal line,
wherein both N and M are positive integers, and N is greater than or equal to 2.

15. The gate drive circuit according to claim 13, wherein in a case where a reset signal control circuit of each the plurality of shift register units is connected to a reset control input terminal,
except for a last shift register unit of the plurality of shift register units, a reset control input terminal of a shift register unit of the plurality of shift register units is connected to an output terminal of a (L+1)-th shift register unit of the plurality of shift register units, a first reset to urinal of the L-th shift register unit is connected to a second clock signal terminal of the (L+1)-th shift register unit,
and L is an integer greater than 0.

16. A display device, comprising the gate drive circuit according to claim 13.

* * * * *